US010892144B2

(12) United States Patent
Oka

(10) Patent No.: US 10,892,144 B2
(45) Date of Patent: Jan. 12, 2021

(54) PLASMA PROCESSING APPARATUS, MONITORING METHOD, AND MONITORING PROGRAM

(71) Applicant: TOKYO ELECTRON LIMITED, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/592,229

(22) Filed: Oct. 3, 2019

(65) Prior Publication Data

US 2020/0111650 A1    Apr. 9, 2020

(30) Foreign Application Priority Data

Oct. 5, 2018  (JP) ................................. 2018-190173
May 29, 2019  (JP) ................................. 2019-100392

(51) Int. Cl.
*H01J 37/32*    (2006.01)

(52) U.S. Cl.
CPC .. *H01J 37/32935* (2013.01); *H01J 37/32522* (2013.01); *H01J 37/32743* (2013.01); *H01J 37/32532* (2013.01)

(58) Field of Classification Search
None
See application file for complete search history.

(56) References Cited

U.S. PATENT DOCUMENTS

| 2008/0283088 A1* | 11/2008 | Shima | H01J 37/32862 134/1.1 |
| 2009/0105980 A1* | 4/2009 | Tetsuka | H01J 37/32935 702/76 |
| 2015/0170977 A1* | 6/2015 | Singh | H01L 21/67103 438/16 |

FOREIGN PATENT DOCUMENTS

JP    2008-251462 A    10/2008

* cited by examiner

*Primary Examiner* — Vip Patel
(74) *Attorney, Agent, or Firm* — Rothwell, Figg, Ernst & Manbeck, P.C.

(57) ABSTRACT

A plasma processing apparatus includes a storage unit, an acquisition unit and a monitoring unit. The storage unit stores change information indicating a change in a value for a temperature of a mounting table when a processing condition of plasma processing for a target object mounted on the mounting table is changed. The acquisition unit acquires the value for the temperature of the mounting table in a predetermined cycle. The monitoring unit monitors, based on the change information, a change in the processing condition of the plasma processing from the change in the value for the temperature of the mounting table acquired by the acquisition unit.

18 Claims, 13 Drawing Sheets

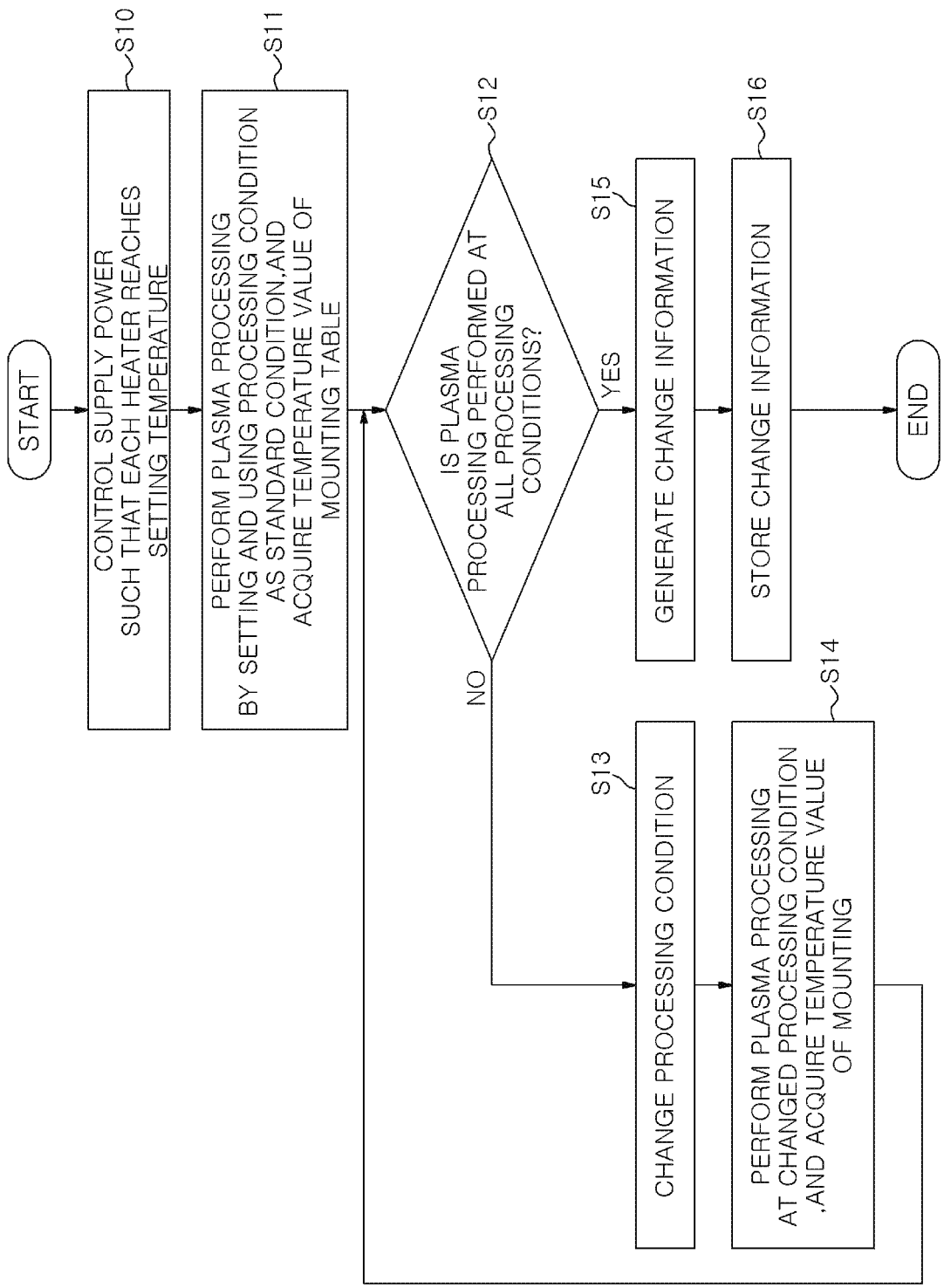

PLASMA PROCESSING APPARATUS, MONITORING METHOD, AND MONITORING PROGRAM

CROSS-REFERENCE TO RELATED APPLICATIONS

This application claims priority to Japanese Patent Application Nos. 2018-190173 and 2019-100392, respectively filed on Oct. 5, 2018 and May 29, 2019, the entire contents of which are incorporated herein by reference.

TECHNICAL FIELD

The present disclosure relates to a plasma processing apparatus, a monitoring method, and a monitoring program.

BACKGROUND

Japanese Patent Application Publication No. 2008-251462 proposes a technique for calculating a difference between an input power value of a matching unit and a power setting value of a high-frequency power that is supplied to a processing chamber from a high-frequency power supply through the matching unit, and for controlling an output power of the high-frequency power supply such that the input power value of the matching unit becomes the power setting value.

SUMMARY

The present disclosure provides a technique capable of detecting an abnormality without disposing a sensor.

In accordance with an aspect of the present disclosure, there is provided a plasma processing apparatus including: a storage unit configured to store change information indicating a change in a value for a temperature of a mounting table when a processing condition of plasma processing for a target object mounted on the mounting table is changed; an acquisition unit configured to acquire the value for the temperature of the mounting table in a predetermined cycle; and a monitoring unit configured to monitor, based on the change information, a change in the processing condition of the plasma processing from the change in the value for the temperature of the mounting table acquired by the acquisition unit.

BRIEF DESCRIPTION OF THE DRAWINGS

The objects and features of the present disclosure will become apparent from the following description of embodiments, given in conjunction with the accompanying drawings, in which:

FIG. 9 is a flowchart showing an example of a flow of a generation processing according to the embodiment;

DETAILED DESCRIPTION

Hereinafter, embodiments of a plasma processing apparatus, a monitoring method, and a monitoring program will be described in detail with reference to drawings. In the present disclosure, for example, an apparatus that performs plasma etching will be described in detail as a specific example of the plasma processing apparatus. The plasma processing apparatus, the monitoring method, and the monitoring program to be disclosed are not limited by the embodiments.

However, for example, the plasma processing apparatus may include sensors, such as various probes and various electric sensors in a processing chamber, and the sensors detect a state of plasma. Thus, abnormality is detected from a change of the state of plasma in the plasma processing apparatus. However, when the sensors are disposed in the processing chamber, the manufacturing cost of the plasma processing apparatus increases. Further, when the sensors are disposed in the processing chamber, the sensors become a singular point and deteriorate the uniformity of the plasma processing around the singular point. Therefore, it is desirable to detect the abnormality in the plasma processing apparatus without disposing such sensors.

<Configuration of Plasma Processing Apparatus>

Figure 1:
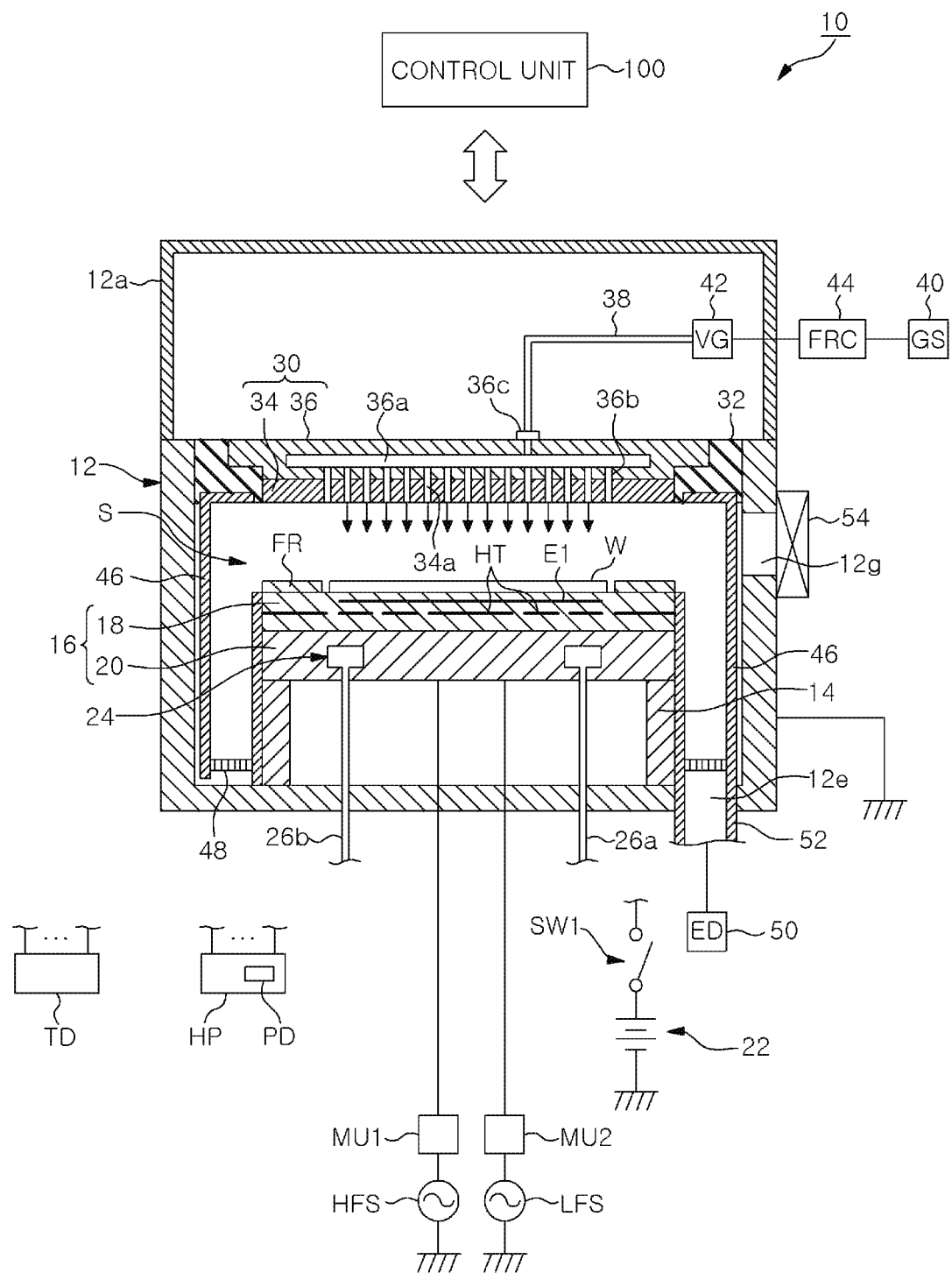
FIG. 1 is a schematic view showing a plasma processing apparatus according to an embodiment.

First, a configuration of a plasma processing apparatus 10 according to the embodiment will be described. FIG. 1 is a schematic view showing the plasma processing apparatus according to the embodiment. FIG. 1 is a vertical cross sectional view showing a schematic structure of the plasma processing apparatus 10 according to the embodiment. The plasma processing apparatus 10 shown in FIG. 1 is a capacitively-coupled parallel-plate plasma etching apparatus. The plasma processing apparatus 10 includes a substantially cylindrical processing chamber 12. The processing chamber is made of, e.g., aluminum. Further, the processing chamber 12 has an anodically oxidized surface.

A mounting table 16 is provided in the processing chamber 12. The mounting table 16 includes an electrostatic chuck 18 and a base 20. An upper surface of the electrostatic chuck 18 is a mounting surface on which a target object to be subjected to plasma processing is mounted. In the present embodiment, a wafer W that is the target object is mounted on the upper surface of the electrostatic chuck 18. The base 20 has a substantially disk shape, and a main part thereof is made of a conductive metal, e.g., aluminum. The base 20 serves as a lower electrode. The base 20 is supported by a support portion 14. The support portion 14 is a cylindrical member vertically extending upward from a bottom portion of the processing chamber 12.

A first high-frequency power supply HFS is electrically connected to the base 20 through a matching unit MU1. The first high-frequency power supply HFS is a power supply for plasma generation and applies a high-frequency power having a frequency in a range from 27 to 100 MHz, e.g., 40 MHz. Accordingly, plasma is generated directly on the base 20. The matching unit MU1 includes a circuit for matching output impedance of the first high-frequency power supply HFS with input impedance of a load side (base 20 side).

Further, a second high-frequency power supply LFS is electrically connected to the base 20 through the matching unit MU2. The second high-frequency power supply LFS generates and applies a high-frequency power (high-frequency bias power) for attracting ions into the wafer W to the base 20. As a result, a bias potential is generated in the base 20. The high-frequency bias power has a frequency in a range from 400 kHz to 13.56 MHz, e.g., 3 MHz. The matching unit MU2 includes a circuit for matching output impedance of the second high-frequency power supply LFS with input impedance of the load side (base 20 side).

The electrostatic chuck 18 is disposed on the base 20. The wafer W is attracted to and held on the electrostatic chuck 18 by an electrostatic force such as Coulomb force. The electrostatic chuck 18 includes an electrode E1 for electrostatic adsorption in a main body portion formed of ceramic. A DC power supply 22 is electrically connected to the electrode E1 through a switch SW1. The electrostatic force for attracting and holding the wafer W depends on a value of a DC voltage applied from the DC power supply 22.

Further, a focus ring FR is disposed to surround the wafer W on the electrostatic chuck 18. The focus ring FR is provided to improve uniformity of plasma processing. The focus ring FR is formed of a material appropriately selected depending on the plasma processing to be performed. For example, the focus ring FR may be formed of silicon or quartz.

A coolant channel 24 is formed in the base 20. The coolant is supplied to the coolant channel 24 from a chiller unit provided outside of the processing chamber 12 through a line 26a. The coolant supplied to the coolant channel 24 returns to the chiller unit through a line 26b.

An upper electrode 30 is provided in the processing chamber 12. The upper electrode 30 is disposed above the mounting table 16 to be opposite to the base 20. The base and the upper electrode 30 are arranged to be substantially parallel to each other.

The upper electrode 30 is supported at an upper portion of the processing chamber 12 via an insulating shielding member 32. The upper electrode 30 includes an electrode plate 34 and an electrode holder 36. The electrode plate 34 faces a processing space S, and a plurality of gas injection holes 34a are formed in the electrode plate 34. The electrode plate 34 is formed of a low resistance conductor or semiconductor with a small Joule heat. The upper electrode 30 is configured to perform a temperature control. For example, the upper electrode 30 includes a temperature control mechanism such as a heater (not shown) to perform the temperature control.

The electrode holder 36 detachably holds the electrode plate 34. The electrode holder 36 is made of a conductive material such as aluminum. A gas diffusion chamber 36a is formed in the electrode holder 36. In the electrode holder 36, a plurality of gas through holes 36b extend downward from the gas diffusion chamber 36a to communicate with the gas injection holes 34a. Further, a gas inlet port 36c through which a processing gas is introduced into the gas diffusion chamber 36a is formed in the electrode holder 36. A gas supply line 38 is connected to the gas inlet port 36c.

A gas source group (GS) 40 is connected to the gas supply line 38 through a valve group (VG) 42 and a flow rate controller group (FRC) 44. The valve group 42 includes a plurality of opening and closing valves. The flow rate controller group 44 includes a plurality of flow rate controllers that are mass flow controllers. Further, the gas source group 40 includes a plurality of gas sources for multiple kinds of gases required for plasma processing. The gas sources of the gas source group 40 are connected to the gas supply line 38 through the opening and closing valves and the mass flow controllers corresponding thereto.

In the plasma processing apparatus 10, one or more gases from one or more selected gas sources among the gas sources of the gas source group 40 are supplied to the gas supply line 38. Each of one or more gases supplied to the gas supply line 38 is supplied to the gas diffusion chamber 36a and is injected to the processing space S through the gas through holes 36b and the gas injection holes 34a.

Further, as illustrated in FIG. 1, the plasma processing apparatus 10 further includes a ground conductor 12a. The ground conductor 12a is a substantially cylindrical ground conductor and extends upward from the sidewall of the processing chamber 12 so as to be located at a position higher than the height position of the upper electrode 30.

Further, in the plasma processing apparatus 10, the deposition shield 46 is detachably provided along the inner wall of the processing chamber 12. Further, the deposition shield 46 is also provided at an outer periphery of the support portion 14. The deposition shield 46 prevents etching by-products (deposits) from adhering to the processing chamber 12. The deposition shield 46 may be made of aluminum coated with ceramic such as $Y_2O_3$ or the like. The deposition shield 46 is configured to perform a temperature control. For example, the deposition shield 46 includes a temperature control mechanism such as a heater (not shown) to perform the temperature control.

A gas exhaust plate 48 is provided at the bottom portion side of the processing chamber 12 and between the support portion 14 and the inner wall of the processing chamber 12. The gas exhaust plate 48 may be formed by coating aluminum with ceramic, e.g., $Y_2O_3$ or the like. A gas exhaust port 12e is provided below the gas exhaust plate 48 in the processing chamber 12. A gas exhaust unit (ED) 50 is connected to the gas exhaust port 12e through a gas exhaust line 52. The gas exhaust unit 50 includes a vacuum pump such as a turbo molecular pump or the like so that a pressure in the space in the processing chamber 12 can be decreased to a predetermined vacuum level when performing the plasma processing. Further, a loading/unloading port 12g for the wafer W is provided at the sidewall of the processing chamber 12. The loading/unloading port 12g can be opened and closed by a gate valve 54.

The operation of the plasma processing apparatus 10 configured as mentioned above is integrally controlled by a control unit 100. The control unit 100 is, e.g., a computer and controls the respective components of the plasma processing apparatus 10. The operation of the plasma processing apparatus 10 is integrally controlled by the control unit 100.

<Configuration of Mounting Table>

Figure 2:
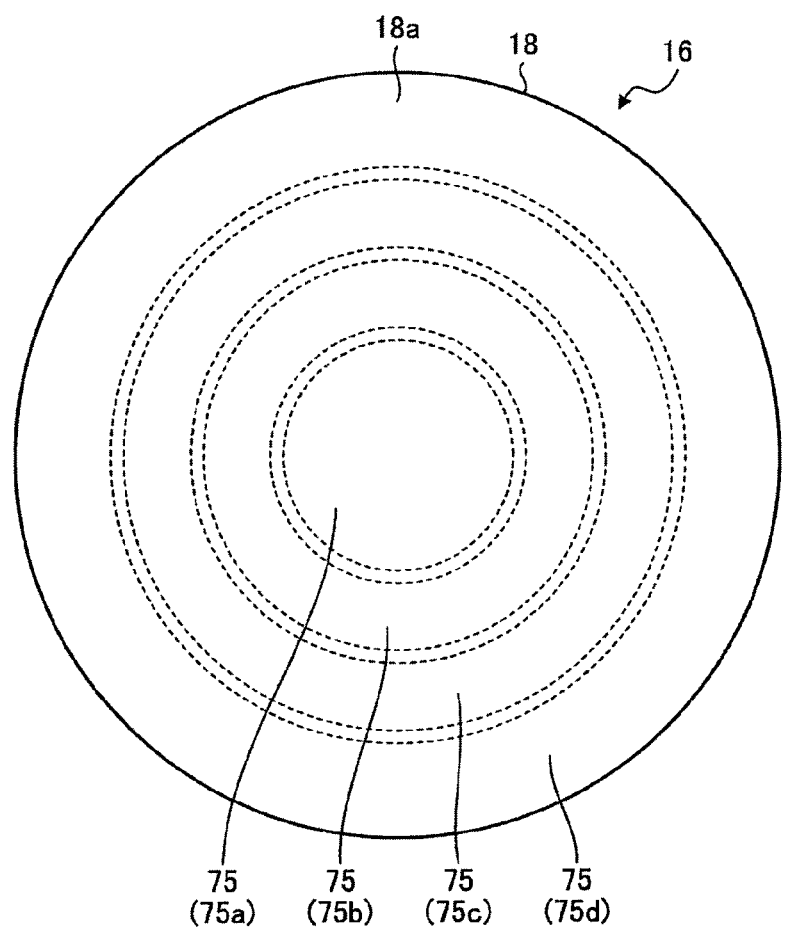
FIG. 2 is a plan view showing a mounting table according to the embodiment.

Next, the mounting table 16 will be described in detail. FIG. 2 is a plan view showing the mounting table according to the embodiment. As described above, the mounting table 16 includes the electrostatic chuck 18 and the base 20. The electrostatic chuck 18 is formed of ceramic, and an upper surface thereof is a mounting region 18*a* on which the wafer W and the focus ring FR are mounted. The mounting region 18*a* becomes a substantially circular region in the plan view. As shown in FIG. 1, the electrostatic chuck 18 includes the electrode E1 for electrostatic adsorption in a region where the wafer W is disposed. The electrode E1 is connected to the DC power supply 22 through the switch SW1.

As shown in FIG. 1, heaters HT are provided below the electrode E1 in the mounting region 18*a*. The mounting region 18*a* is divided into a plurality of division regions 75, and the heater HT is provided in each division region 75. For example, as shown in FIG. 2, the mounting region 18*a* includes a central circular division region 75*a* (center portion) and three annular division regions 75*b* to 75*d* (a middle portion, an edge portion, and a focus ring portion). The heaters HT are provided in the division region 75*a* to 75*d*, respectively. The wafer W is disposed on the division regions 75*a* to 75*c*. The focus ring FR is disposed on the division region 75*d*. In the present embodiment, the upper surface (mounting surface) of the mounting table 16 is divided into four division regions 75*a* to 75*d* to perform the temperature control. However, the number of division regions 75 is not limited to four, and may be two or three, or may be five or more.

The heaters HT are individually connected to the heater power supply HP shown in FIG. 1 through wirings (not shown). The heater power supply HP supplies electric powers that are adjusted individually to the heaters HT under the control of the control unit 100. As a result, the heat generated by each heater HT is individually controlled, and the temperatures of the division regions in the mounting region 18*a* are individually adjusted.

The heater power supply HP includes a power detection unit PD configured to detect a supply power supplied to each heater HT. Further, the power detection unit PD may be provided separately from the heater power supply HP by disposing on a wiring through which electric power flows from the heater power supply HP to each heater HT. The power detection unit PD detects the supply power supplied to each heater HT. For example, the power detection unit PD detects the amount of power [W] as the supply power supplied to each heater HT. The heater HT generates heat in accordance with the amount of power. For this reason, the amount of power supplied to the heater HT indicates a heater power. The power detection unit PD notifies the control unit 100 of power data indicating the detected supply power to each heater HT.

Further, the mounting table 16 includes a temperature sensor (not shown) configured to detect a temperature of the heater HT in each division region 75 of the mounting region 18*a*. The temperature sensor may be an element that measures the temperature while providing separately from the heater HT. Further, the temperature sensor may be an element that is disposed on a wiring through which electric power flows to the heater HT and detects the temperature by using the property in which electrical resistance increases as the temperature increases. Sensing values detected by each temperature sensor are sent to a temperature measuring unit TD. The temperature measuring unit TD measures a temperature of each division region 75 of the mounting region 18*a* from the respective sensor values. The temperature measuring unit TD notifies the control unit 100 of temperature data indicating the temperature of each division region 75 of the mounting region 18*a*.

Further, heat transfer gas such as He gas may be supplied between the upper surface of the electrostatic chuck 18 and the rear surface of the wafer W by a heat transfer gas supply mechanism and a gas supply line that are not illustrated.

<Configuration of Control Unit>

Figure 3:
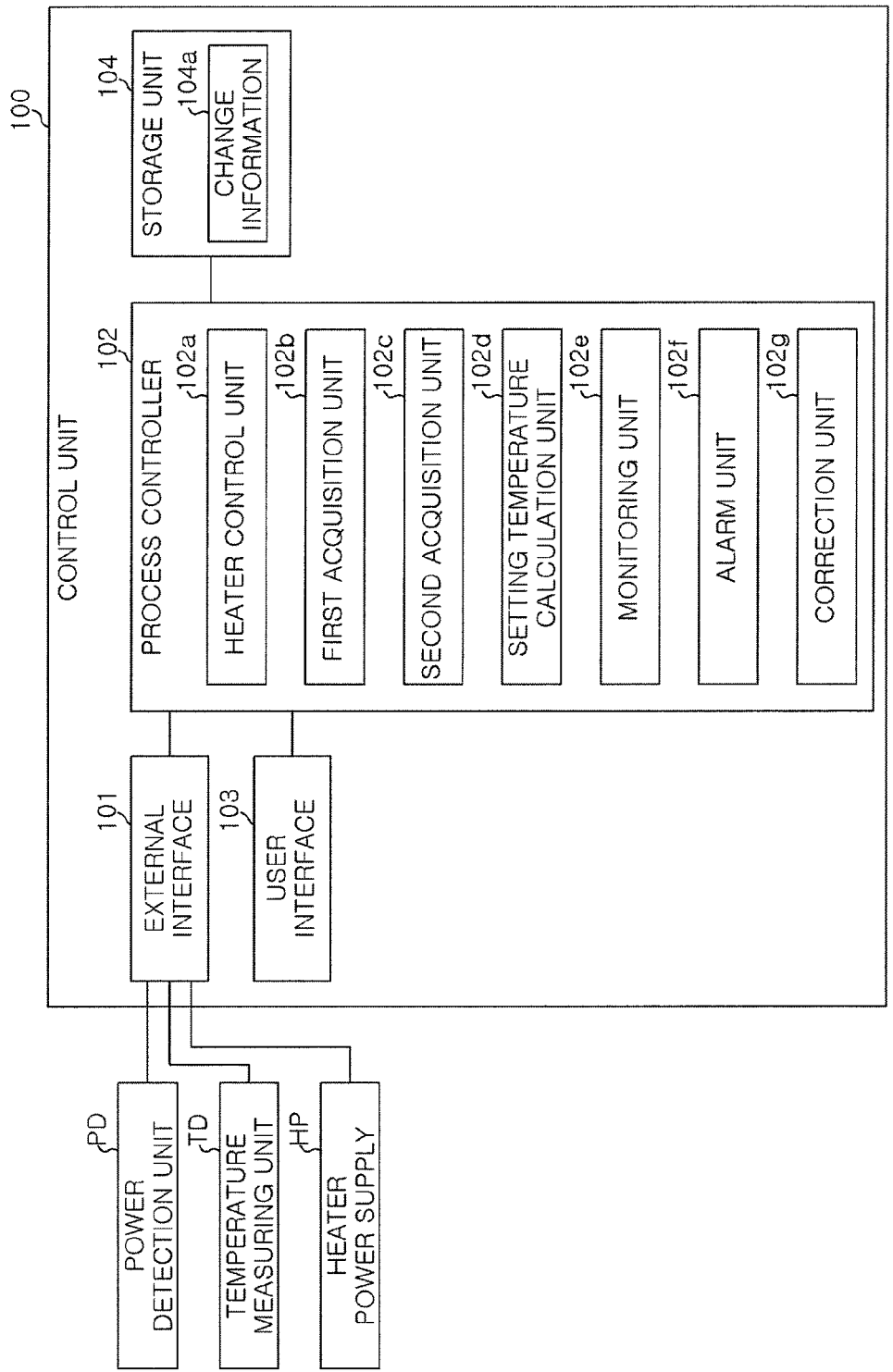
FIG. 3 is a block diagram showing a schematic configuration of a control unit that controls the plasma processing apparatus according to the embodiment.

Next, the control unit 100 will be described in detail. FIG. 3 is a block diagram showing a schematic configuration of the control unit that controls the plasma processing apparatus according to the embodiment. The control unit 100 includes an external interface 101, a process controller 102, a user interface 103, and a storage unit 104.

The external interface 101 is configured to communicate with the respective components of the plasma processing apparatus 10 to input and output various types of data. For example, power data indicating the supply power from the power detection unit PD to each heater HT is input to the external interface 101. Further, temperature data indicating the temperature of each division region 75 of the mounting region 18*a* is input to the external interface 101 from the temperature measuring unit TD. Further, the external interface 101 outputs to the heater power supply HP control data for controlling the supply power supplied to each heater HT.

The process controller 102 includes a central processing unit (CPU) and controls the respective components of the plasma processing apparatus 10.

The user interface 103 includes a keyboard through which a process manager input commands to manage the plasma processing apparatus 10, a display for visualizing and displaying an operation status of the plasma processing apparatus 10, and the like.

The storage unit 104 stores therein a control program (software) for realizing various processes performed by the plasma processing apparatus 10 under the control of the process controller 102 and recipes including processing condition data and the like. The storage unit 104 also stores parameters relating to an apparatus, a process, and the like for performing plasma processing. Further, the control program, the recipe, and the parameters may be stored in a computer-readable storage medium (e.g., a hard disk, an optical disk such as a DVD, a flexible disk, a semiconductor memory, or the like). Alternatively, the control program, the recipe, and the parameters may be stored in another device to be read online, e.g., through a dedicated line and used.

The process controller 102 includes an internal memory for storing a program or data, reads out the control program stored in the storage unit 104, and executes processing of the read-out control program. The process controller 102 serves as various processing units by executing the control program. For example, the process controller 102 serves as a heater control unit 102*a*, a first acquisition unit 102*b*, a second acquisition unit 102*c*, a setting temperature calculation unit 102*d*, a monitoring unit 102*e*, an alarm unit 102*f*, and a correction unit 102*g*. Further, in the present embodiment, although the case where the process controller 102 serves as various processing units will be described as an example, the present disclosure is not limited thereto. For example, the functions of the heater control unit 102*a*, the first acquisition unit 102*b*, the second acquisition unit 102*c*, the setting temperature calculation unit 102*d*, the monitoring unit 102e, the alarm unit 102f, and the correction unit 102g may be distributed and realized by a plurality of controllers.

However, in plasma processing, the progress of processing changes depending on the temperature of the wafer W. For example, in plasma etching, the progress speed of etching changes depending on the temperature of the wafer W. Therefore, in the plasma processing apparatus 10, it is conceivable to control the temperature of the wafer W to a target temperature by using each heater HT.

However, in the plasma processing, heat is input from the plasma toward the wafer W. For this reason, the plasma processing apparatus 10 may not be able to accurately control the temperature of the wafer W in plasma processing to the target temperature.

Figure 4:
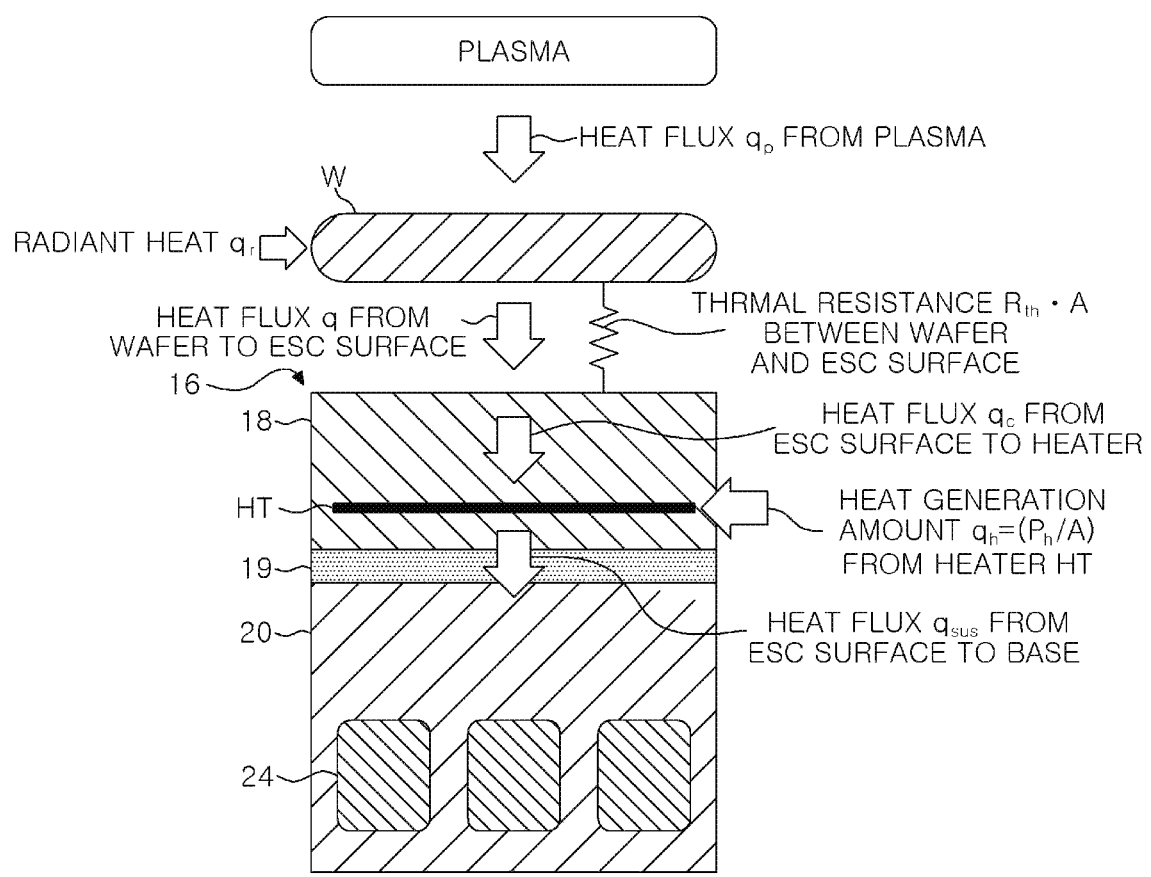
FIG. 4 is a schematic view showing a flow of energy affecting a temperature of a wafer.

A flow of energy affecting the temperature of the wafer W will be described. FIG. 4 is a schematic view showing the flow of energy affecting the temperature of the wafer. In FIG. 4, the wafer W and the mounting table 16 including the electrostatic chuck (ESC) 18 are illustrated in a simplified manner. Further, in an example of FIG. 4, the flow of energy affecting the temperature of the wafer W with respect to one division region 75 of the mounting region 18a of the electrostatic chuck 18 is shown. The mounting table 16 includes the electrostatic chuck 18 and the base 20. The electrostatic chuck 18 and the base 20 are bonded by a bonding layer 19. The heater HT is provided in the mounting region 18a of the electrostatic chuck 18. The coolant channel 24 through which a coolant flows is formed in the base 20.

The heater HT generates heat by the power supplied from the heater power supply HP, and a temperature thereof increases. In FIG. 4, the power supplied to the heater HT is denoted as a heater power $P_h$. In the heater HT, a heat generation amount (heat flux) $q_h$ per unit area, which is obtained by dividing the heater power $P_h$ by an area A of the region where the heater HT of the electrostatic chuck 18 is provided, is generated.

In the plasma processing apparatus 10, when temperatures of internal parts arranged in the processing chamber 12 such as the upper electrode 30 and the deposition shield 46 are controlled, radiant heat is generated from the internal parts. For example, when the temperatures of the upper electrode 30 and the deposition shield 46 are controlled at a high temperature to suppress adhesion of deposits, the radiant heat is input to the wafer W from the upper electrode 30 and the deposition shield 46. In FIG. 4, the radiant heat from the upper electrode 30 and/or the deposition shield 46 to the wafer W is denoted as "$q_r$."

Further, when the plasma processing is performed, heat is input to the wafer W from the plasma. In FIG. 4, heat flux from the plasma per unit area, which is obtained by dividing the heat amount from the plasma to the wafer W by an area of the wafer W, is denoted as "$q_p$." The temperature of the wafer W is increased by input of the heat flux $q_p$ from the plasma and input of the radiant heat $q_r$.

The heat input by the radiant heat is proportional to the temperatures of the internal parts of the processing chamber 12. For example, the heat input by the radiant heat is proportional to the temperatures of the upper electrode 30 and/or the deposition shield 46. It is known that the heat input from the plasma is proportional to the product of the amount of ions in the plasma irradiated to the wafer W and a bias potential for attracting the ions in the plasma to the wafer W. The amount of ions in the plasma irradiated to the wafer W is proportional to an electron density of the plasma. The electron density of the plasma is proportional to the first high-frequency power of the first high-frequency power supply HFS applied for the plasma generation. Further, the electron density of the plasma depends on a pressure inside the processing chamber 12. The bias potential for attracting the ions in the plasma to the wafer W is proportional to the second high-frequency power of the second high-frequency power supply LFS applied for the bias potential generation. Further, the bias potential for attracting the ions in the plasma to the wafer W depends on the pressure inside the processing chamber 12. When the second high-frequency power is not applied to the mounting table 16, the ions are attracted to the mounting table by a potential difference between a plasma potential generated when the plasma is generated and a potential of the mounting table 16.

Further, the heat input from the plasma includes irradiation to the wafer W by electrons or radicals in the plasma or heating by light emission of the plasma, a surface reaction on the wafer W due to ions and radicals, and the like. These components also depend on the powers of the high-frequency power supplies and/or the pressure inside the processing chamber 12. In addition, the heat input from the plasma also depends on device parameters relating to the plasma generation, such as the distance between the mounting table 16 and the upper electrode 30 or the type of gas supplied to the processing space S.

The heat transferred to the wafer W is transferred to the electrostatic chuck 18. Here, not all the heat of the wafer W is transferred to the electrostatic chuck 18, and the heat is transferred to the electrostatic chuck 18 depending on the difficulty of heat transfer such as the degree of contact between the wafer W and the electrostatic chuck 18. The difficulty of heat transfer, which is the thermal resistance, is inversely proportional to a sectional area normal to a heat transfer direction. For this reason, in FIG. 4, the difficulty of heat transfer from the wafer W to a surface of the electrostatic chuck 18 is denoted as the thermal resistance $R_{th} \cdot A$ per unit area between the wafer W and the surface of the electrostatic chuck 18 where A is the area of the region (division region 75) where the heater HT is provided. $R_{th}$ is a thermal resistance in the whole region where the heater HT is provided. Further, in FIG. 4, the heat input amount from the wafer W to the surface of the electrostatic chuck 18 is denoted as heat flux q per unit area from the wafer W to the surface of the electrostatic chuck 18. Further, the thermal resistance $R_{th} \cdot A$ depends on the surface state of the electrostatic chuck 18, the value of a DC voltage applied from the DC power supply 22 during the holding of the wafer W, and the pressure of the heat transfer gas supplied between an upper surface of the electrostatic chuck 18 and a rear surface of the wafer W. In addition, the thermal resistance $R_{th} \cdot A$ also depends on device parameters involved in the thermal resistance or thermal conductivity.

The heat transferred to the surface of the electrostatic chuck 18 increases the temperature of the electrostatic chuck 18 and is also transferred to the heater HT. In FIG. 4, a heat input amount from the surface of the electrostatic chuck 18 to the heater HT is denoted as heat flux $q_c$ per unit area from the surface of the electrostatic chuck 18 to the heater HT.

Meanwhile, the base 20 is cooled by a coolant flowing through the coolant channel 24 and cools the electrostatic chuck 18 being in contact therewith. At this time, in FIG. 4, a heat loss amount from a rear surface of the electrostatic chuck 18 to the base 20 through the bonding layer 19 is denoted as heat flux $q_{sus}$ per unit area from the rear surface of the electrostatic chuck 18 to the base 20. The heater HT is cooled by this heat loss, and thereby, the temperature is reduced.

Figure 5A:
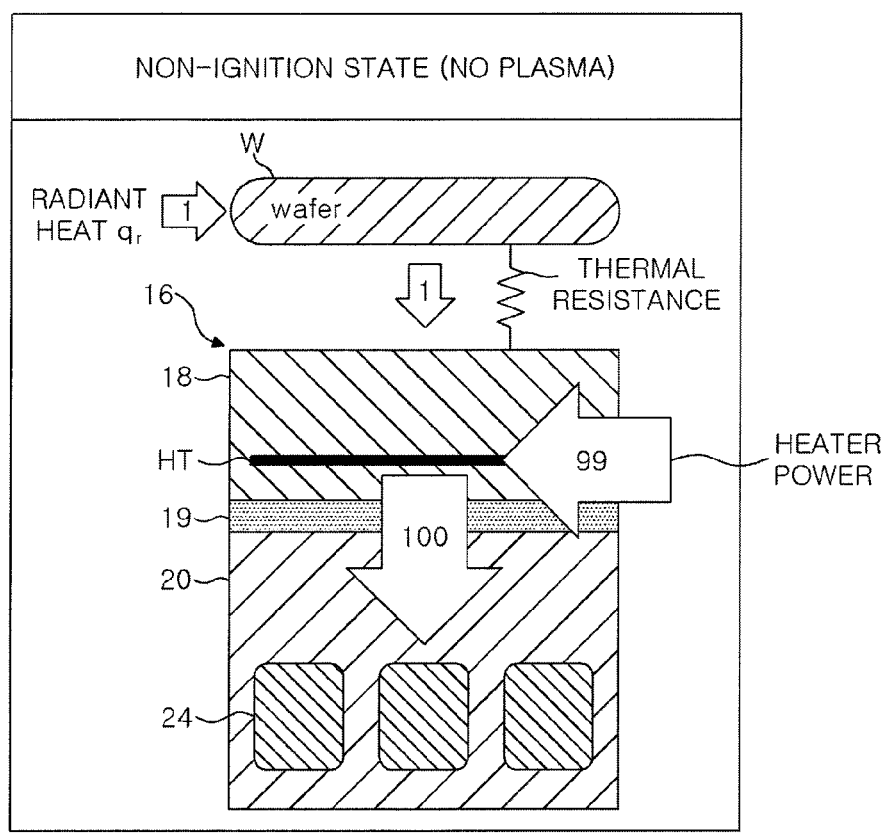
FIG. 5A is a schematic view showing the flow of energy in a non-ignition state.

When the temperature of the heater HT is controlled to be constant, the sum of the heat input amount input to the heater HT and the heat generation amount generated by the heater HT is equal to the heat loss amount lost from the heater HT, at a position of the heater HT. For example, in a non-ignition state in which the plasma is not ignited, the sum of the heat amount of the radiant heat $q_r$ and the heat generation amount generated by the heater HT is equal to the heat loss amount lost from the heater HT. FIG. 5A is a schematic view showing a flow of energy of the non-ignition state. In an example of FIG. 5A, the heat amount of "100" is lost from the heater HT by the cooling from the base 20. A heat amount of "1" is transferred to the wafer W by radiant heat. When the temperature of the wafer W or the electrostatic chuck 18 is in a substantially stable state, the heat transferred to the wafer W is transferred to the electrostatic chuck 18 without mitigation. The heat amount of "1" input to the wafer W is input to the heater HT through the electrostatic chuck 18. When the temperature of the heater HT is controlled to be constant, the heat amount of "99" is generated in the heater HT by the heater power $P_h$ from the heater power supply HP.

Figure 5B:
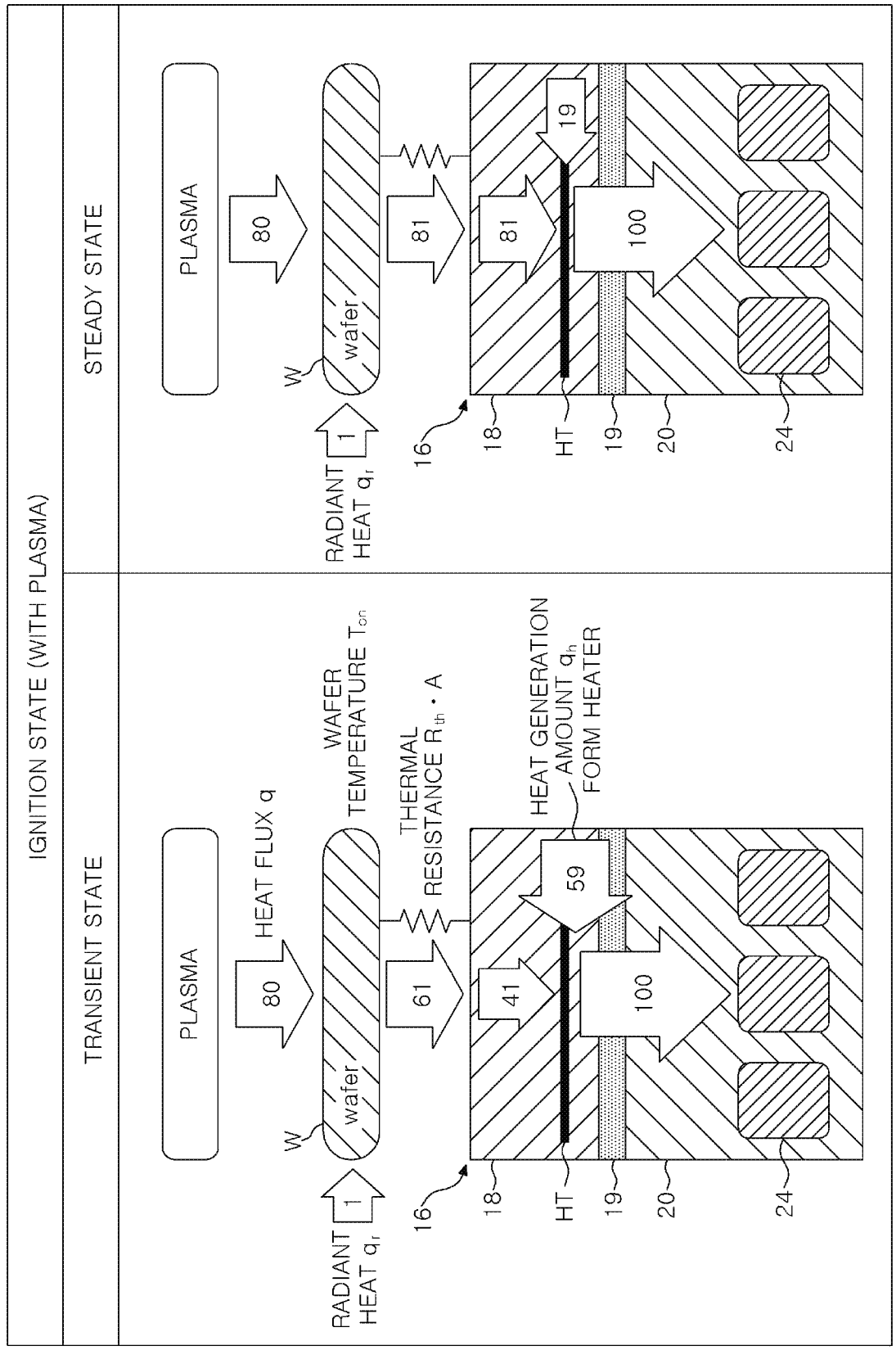
FIG. 5B is a schematic view showing the flow of energy in an ignition state.

Meanwhile, in an ignition state in which the plasma is ignited, the heater HT is also heated from the plasma through the electrostatic chuck 18. FIG. 5B is a schematic view showing the flow of energy in the ignition state. Here, the ignition state includes a transient state and a steady state. In the transient state, for example, a heat input amount of the wafer W or the electrostatic chuck 18 is greater than the heat loss amount, and thereby, the temperature of the wafer W or the electrostatic chuck 18 tends to increase over time. In the steady state, the heat input amount and the heat loss amount of the wafer W or the electrostatic chuck 18 are equal to each other, and thereby, the temperature of the wafer W or the electrostatic chuck 18 does not tend to increase over time, and the temperature becomes substantially constant.

Further, in the example of FIG. 5B, the heat amount of "100" is lost from the heater HT by the cooling from the base 20. In the case of the ignition state, the temperature of the wafer W increases due to the heat input from the plasma until the wafer reaches the steady state. To the heater HT, heat is transferred from the wafer W through the electrostatic chuck 18. As described above, when the temperature of the heater HT is controlled to be constant, the heat amount input to the heater HT is equal to the heat amount lost from the heater HT. The heat amount required for maintaining the temperature of the heater HT to be constant is reduced in the heater HT. For this reason, the power supplied to the heater HT is reduced.

For example, in an example of the "transient state" shown in FIG. 5B, a heat amount of "80" is transferred from the plasma to the wafer W. Further, the heat amount of "1" is transferred to the wafer W by radiant heat. The heat transferred to the wafer W is transferred to the electrostatic chuck 18. Further, when the temperature of the wafer W is not in the steady state, a part of the heat transferred to the wafer W contributes to an increase of the temperature of the wafer W. The heat amount contributing to the increase in the temperature of the wafer W depends on the heat capacity of the wafer W. Therefore, the heat amount of "61" among the heat amount of "81" transferred to the wafer W is transferred from the wafer W to the surface of the electrostatic chuck 18. The heat transferred to the surface of the electrostatic chuck 18 is transferred to the heater HT. Further, when the temperature of the electrostatic chuck 18 is not in the steady state, a part of the heat transferred to the surface of the electrostatic chuck 18 contributes to an increase of the temperature of the electrostatic chuck 18. The heat amount contributing to the increase in the temperature of the electrostatic chuck 18 depends on the heat capacity of the electrostatic chuck 18. Therefore, a heat amount of "41" among the heat amount of "61" transferred to the surface of the electrostatic chuck 18 is transferred to the heater HT. For this reason, when the temperature of the heater HT is controlled to be constant, a heat amount of "59" is supplied to the heater HT by the heater power $P_h$ from the heater power supply HP.

Further, in the steady state shown in FIG. 5B, the heat amount of "80" is transferred from the plasma to the wafer W. Further, the heat amount of "1" is transferred to the wafer W by radiant heat. The heat transferred to the wafer W is transferred to the electrostatic chuck 18. Further, when the temperature of the wafer W is in the steady state, the heat input amount and the heat output amount of the wafer W are equal to each other. Therefore, the heat amount of "81" transferred from the plasma to the wafer W is transferred from the wafer W to the surface of the electrostatic chuck 18. The heat transferred to the surface of the electrostatic chuck 18 is transferred to the heater HT. When the temperature of the electrostatic chuck 18 is in the steady state, a heat input amount and a heat output amount of the electrostatic chuck 18 are equal to each other. Therefore, the heat amount of "81" transferred to the surface of the electrostatic chuck 18 is transferred to the heater HT. For this reason, when the temperature of heater HT is controlled to be constant, a heat amount of "19" is supplied to the heater HT by the heater power $P_h$ from the heater power supply HP.

As illustrated in FIGS. 5A and 5B, the power supplied to the heater HT is lower in the ignition state than that in the non-ignition state. Further, in the ignition state, the power supplied to the heater HT is lowered until the steady state.

Further, as shown in FIGS. 5A and 5B, when the temperature of the heater HT is controlled to be constant, even if the state is any of the "non-ignition state," the "transient state," and the "steady state," the heat amount of "100" is lost from the heater HT by the cooling from the base 20. That is, the heat flux $q_{sus}$ per unit area from the heater HT to the coolant supplied to the coolant channel 24 formed inside the base 20 is always constant, and a temperature gradient from the heater HT to the coolant is always constant. For this reason, the temperature sensor used to control the temperature of the heater HT to be constant does not need to be directly installed in the heater HT. For example, the temperature difference between the heater HT and the temperature sensor is always constant as long as the temperature sensor is installed between the heater HT and the coolant, such as the rear surface of the electrostatic chuck 18, inside of the bonding layer 19, and inside of the base 20. Thus, by calculating the temperature difference $\Delta T$ between the temperature sensor and the heater HT using thermal conductivity, thermal resistance, and the like of a material between heater HT and the temperature sensor, and by adding the temperature difference $\Delta T$ to a value of the temperature detected by the temperature sensor, it is possible to output the temperature of the heater HT and to control the actual temperature of the heater HT so as to be constant.

Figure 6A:
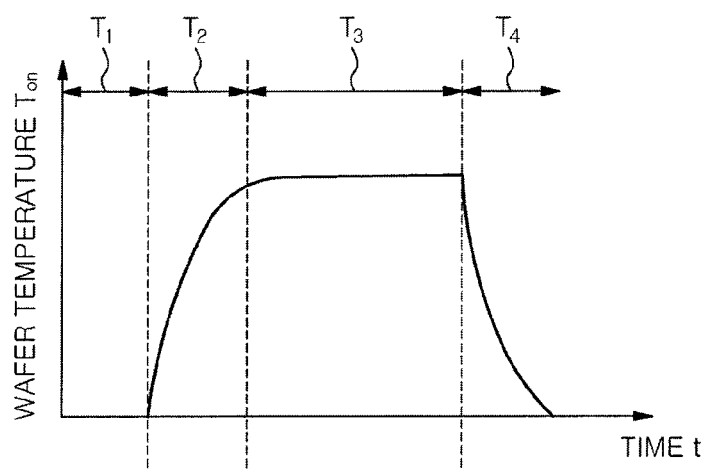
FIGS. 6A and 6B show an example of a change in temperature of a wafer and example of a change in power supplied to a heater.
Figure 6B:
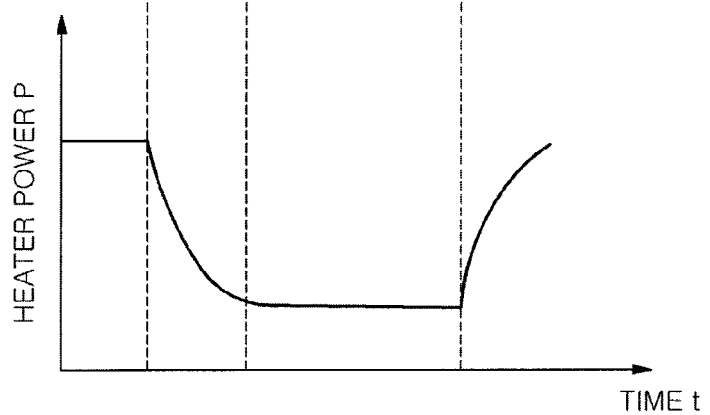

FIGS. 6A and 6B show an example of a change in the temperature of the wafer and an example of a change in the supply power to the heater. FIG. 6A shows the change in the temperature of the wafer W. FIG. 6B shows the change in the supply power to the heater HT. FIGS. 6A and 6B illustrate an example of a result of measuring the temperature of the wafer W and the supply power to the heater HT by controlling the temperature of the heater HT so as to be constant, and igniting the plasma from a non-ignition state in which the plasma is not ignited. The temperature of the wafer W is measured by using a wafer for temperature measurement such as Etch Temp sold by KLA-Tencor. The wafer for temperature measurement is expensive. Thus, using the wafer for temperature measurement for controlling the temperature of each heater HT of the plasma processing apparatus 10 at a mass production site leads to cost increase. Further, using the wafer for temperature measurement for controlling the temperature of each heater HT of the plasma processing apparatus 10 at the mass production site also leads to productivity reduction.

A period T1 shown in FIGS. 6A and 6B is the non-ignition state in which the plasma is not ignited. In the period T1, the supply power to the heater HT is constant. A period T2 shown in FIGS. 6A and 6B is the ignition state in which the plasma is ignited and in the transient state. In the period T2, the supply power to the heater HT is decreased. In the period T2, the temperature of the wafer W increases to a certain temperature. A period T3 shown in FIGS. 6A and 6B is the ignition state in which the plasma is ignited. In the period T3, the temperature of the wafer W becomes constant and in the steady state. If the electrostatic chuck 18 also enters the steady state, a tendency of the supply power to decrease stabilizes and the supply power to the heater HT becomes substantially constant. A period 14 shown in FIGS. 6A and 6B is the non-ignition state in which the plasma is removed. In the period 14, since the heat input from the plasma to the wafer W disappears, the temperature of the wafer W is reduced and the supply power to the heater HT is increased.

The tendency of the power supplied to the heater HT to decrease in the transient state, illustrated in the period T2 of FIGS. 6A and 6B, changes due to the heat input amount from the plasma to the wafer W, the thermal resistance between the wafer W and the surface of the electrostatic chuck 18, and the like.

Figure 7:
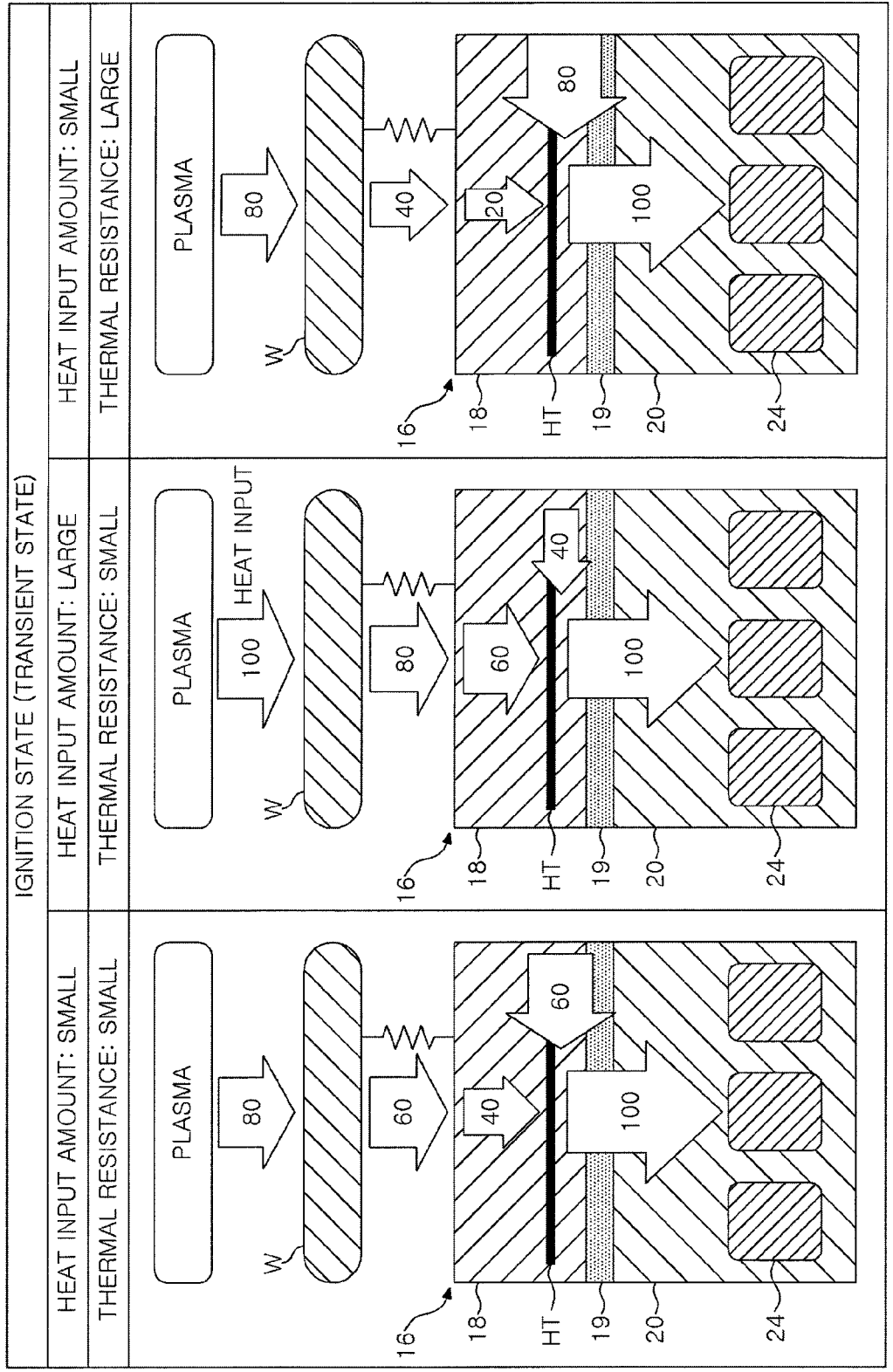
FIG. 7 is a schematic view showing the flow of energy in the ignition state.

FIG. 7 is a schematic view showing a flow of energy in the ignition state. Further, FIG. 7 illustrates an example of the transient state. Further, the heat input of the radiant heat is omitted due to a small influence. For example, in FIG. 7, the heat amount of "80" is transferred from the plasma to the wafer W in an example of "heat input amount: small and thermal resistance: small." Among the heat amount of "80" transferred from the plasma to the wafer W, the heat amount of "60" is transferred from the wafer W to the surface of the electrostatic chuck 18. Among the heat amount of "60" transferred to the surface of the electrostatic chuck 18, the heat amount of "40" is transferred to the heater HT. For example, when the temperature of the heater HT is controlled to be constant, the heat amount of "60" is supplied to the heater HT by heater power $P_h$ from the heater power supply HP.

Further, in FIG. 7, the heat amount of "100" is transferred from the plasma to the wafer W in an example of "heat input amount: large and thermal resistance: small." Among the heat amount of "100" transferred from the plasma to the wafer W, the heat amount of "80" is transferred from the wafer W to the surface of the electrostatic chuck 18. Among the heat amount of "80" transferred to the surface of the electrostatic chuck 18, the heat amount of "60" is transferred to the heater HT. For example, when the temperature of the heater HT is controlled to be constant, the heat amount of "40" is supplied to the heater HT by heater power $P_h$ from the heater power supply HP.

In FIG. 7, the heat amount of "80" is transferred from the plasma to the wafer W in an example of "heat input amount: small and thermal resistance: large." Among the heat amount of "80" transferred from the plasma to the wafer W, the heat amount of "40" is transferred from the wafer W to the surface of the electrostatic chuck 18. Among the heat amount of "40" transferred to the surface of the electrostatic chuck 18, the heat amount of "20" is transferred to the heater HT. For example, when the temperature of the heater HT is controlled to be constant, the heat amount of "80" is supplied to the heater HT by heater power $P_h$ from the heater power supply HP.

As described above, when the temperature of the heater HT is controlled to be constant, the heater power $P_h$ is changed depending on the heat input amount from the plasma to the wafer W and the thermal resistance between the wafer W and the surface of the electrostatic chuck 18. Therefore, the tendency of the supply power to the heater HT to decrease in the period T2 shown in FIG. 6B is changed by the heat input amount from the plasma to the wafer W, the thermal resistance between the wafer W and the surface of the electrostatic chuck 18, and the like. For this reason, a graph of the supply power to the heater HT in the period T2 may be modeled by taking the heat input amount from the plasma to the wafer W and the thermal resistance between the wafer W and the surface of the electrostatic chuck 18 as parameters. That is, a change in the supply power to the heater HT in the period T2 may be modeled by calculation equations by taking the heat input amount from the plasma to the wafer W and the thermal resistance between the wafer W and the surface of the electrostatic chuck 18 as parameters.

In the present embodiment, the change in the supply power to the heater HT in the period T2 shown in FIG. 6B is modeled as an equation based on unit area. For example, the heat generation amount $q_h$ from the heater HT per unit area when a heat flux is generated from the plasma may be expressed by the following equation (2) in an equation group 1. The heat generation amount $q_{h0}$ from the heater HT per unit area in the steady state when no heat flux is generated from the plasma may be expressed by the following equation (3) in the equation group 1. The thermal resistance $R_{thc} \cdot A$ per unit area between the surface of the electrostatic chuck 18 and the heater HT may be expressed by the following equation (4) in the equation group 1. When $a_1, a_2, a_3, \lambda_1, \lambda_2, \tau_1$, and $\tau_2$ are expressed by the following equations (5) to (11) in the equation group 1 by taking the heat flux $q_p$ and the thermal resistance $R_{th}$ as parameters, the heat generation amount $q_h$ may be expressed by the following equation (1) in the equation group 1.

⟨Equation Group 1⟩

$$q_h = \qquad \qquad (1)$$
$$q_{h0} - q_P - \frac{R_{th} \cdot A \cdot q_P}{R_{the} \cdot A \cdot (\lambda_1 - \lambda_2)} \left\{ \left(1 + \frac{a_2 + a_3}{a_1 \cdot a_3} \cdot \lambda_2 \right)(a_1 + \lambda_1)\exp\left(-\frac{t}{\tau_1}\right) - \left(1 + \frac{a_2 + a_3}{a_1 \cdot a_3} \cdot \lambda_1 \right)(a_1 + \lambda_2)\exp\left(-\frac{t}{\tau_2}\right) \right\}$$

$$q_h = \frac{P_h}{A} \qquad (2)$$

$$q_{h0} = \frac{P_{h0}}{A} \qquad (3)$$

$$R_{the} \cdot A = \frac{z_c}{\kappa_c} \qquad (4)$$

$$a_1 = \frac{1}{\rho_w \cdot C_w \cdot z_w \cdot R_{th} \cdot A} \qquad (5)$$

-continued $$a_2 = \frac{2}{\rho_c \cdot C_c \cdot z_c \cdot R_{th} \cdot A} \quad (6)$$

$$a_3 = \frac{2}{\rho_c \cdot C_c \cdot z_c \cdot R_{the} \cdot A} \quad (7)$$

$$\lambda_1 = \frac{1}{2}\left\{-(a_1 + a_2 + a_3) + \sqrt{(a_1 + a_2 + a_3)^2 - 4a_1 a_3}\right\} \quad (8)$$

$$\lambda_2 = \frac{1}{2}\left\{-(a_1 + a_2 + a_3) - \sqrt{(a_1 + a_2 + a_3)^2 - 4a_1 a_3}\right\} \quad (9)$$

$$\tau_1 = -\frac{1}{\lambda_1} \quad (10)$$

$$\tau_2 = -\frac{1}{\lambda_2} \quad (11)$$

In the equation group 1, $P_h$ is the heater power [W] when the heat flux is generated from the plasma.

$P_{h0}$ is the heater power [W] in the steady state when no heat flux is generated from the plasma.

$q_h$ is the heat generation amount [W/m²] from the heater HT per unit area when the heat flux is generated from the plasma.

$q_{h0}$ is the heat generation amount [W/m²] from the heater HT per unit area in the steady state when no heat flux is generated from the plasma.

$q_p$ is the heat flux [W/m²] per unit area from the plasma to the wafer W.

$R_{th} \cdot A$ is the thermal resistance [K·m²/W] per unit area between the wafer W and the surface of the electrostatic chuck 18.

$R_{thc} \cdot A$ is the thermal resistance [K·m²/W] per unit area between the surface of the electrostatic chuck 18 and the heater.

A is the area [m²] of the division region 75 in which the heater HT is provided.

$\rho_w$ is the density [kg/m³] of the wafer W.

$C_w$ is the heat capacity [J/K·m²] per unit area of the wafer W.

$z_w$ is the thickness [m] of the wafer W.

$\rho_c$ is the density [kg/m³] of ceramic forming the electrostatic chuck 18.

$C_c$ is the heat capacity [J/K·m²] per unit area of the ceramic forming the electrostatic chuck 18.

$z_c$ is the distance [m] from the surface of the electrostatic chuck 18 to the heater HT.

$\kappa_c$ is the thermal conductivity [W/K·m] of the ceramic forming the electrostatic chuck 18.

t is the elapsed time [sec] after the plasma is ignited.

Regarding $a_1$ expressed in the equation (5), $1/a_1$ is a time constant indicating the difficulty of warming the wafer W. Further, with respect to $a_2$ expressed in the equation (6), $1/a_2$ is a time constant indicating the difficulty of heat input into the electrostatic chuck 18 and the difficulty of warming the electrostatic chuck 18. Further, with respect to $a_3$ expressed in the equation (7), $1/a_3$ is a time constant indicating the difficulty of heat infiltration into the electrostatic chuck 18 and the difficulty of warming the electrostatic chuck 18.

The density $\rho_w$ of the wafer W, the heat capacity $C_w$ per unit area of the wafer W, and the thickness $z_w$ of the wafer W are determined in advance from an actual configuration of the wafer W, respectively. The area A of the heater HT, the density $\rho_c$ of ceramic forming the electrostatic chuck 18, and the heat capacity $C_c$ per unit area of the ceramic forming the electrostatic chuck 18 are determined in advance from the actual configuration of the plasma processing apparatus 10, respectively. The distance $z_c$ from the surface of the electrostatic chuck 18 to the heater HT and the thermal conductivity $\kappa_c$ of the ceramic forming the electrostatic chuck 18 are also determined in advance from the actual configuration of the plasma processing apparatus 10. $R_{thc} \cdot A$ is determined in advance by the equation (4) from the thermal conductivity $\kappa_c$ and the distance $z_c$.

The heater power $P_h$ when there is heat flux from the plasma for each elapsed time t after the plasma is ignited, and the heater power $P_{h0}$ in the steady state when there is no heat flux from the plasma may be obtained by measurement using the plasma processing apparatus 10. As expressed by the equation (2), by dividing the obtained heater power $P_h$ by the area A of the heater HT, the heat generation amount $q_h$ of the heater HT per unit area when there is the heat flux from the plasma may be obtained. Further, as expressed by the equation (3), by dividing the obtained heater power $P_{h0}$ by the area A of the heater HT, the heat generation amount $q_{h0}$ of the heater HT per unit area in the steady state when there is no heat flux from the plasma may be obtained.

The heat flux $q_p$ per unit area from the plasma to the wafer W and the thermal resistance $R_{th} \cdot A$ per unit area between the wafer W and the surface of the electrostatic chuck 18 are obtained by performing fitting to the equation (1) by using the measurement result.

In the steady state of FIG. 5B, the heat input amount from the plasma to the wafer W is added from the non-ignition state illustrated in FIG. 5A and is input to the heater HT without mitigation. For this reason, the heat input amount from the plasma to the wafer W may be calculated from a value of the difference between the supply power in the non-ignition state of the period T1 and the supply power in the steady state of the period T3 shown in FIGS. 6A and 6B. For example, the heat flux $q_p$ per unit area from the plasma to the wafer W may be calculated from a value obtained by calculating a difference between the heater power $P_{h0}$ (in the non-ignition state) when there is no heat flux from the plasma and the heater power $P_h$ in the steady state of the period T3 and converting the difference into a value per unit area as expressed by the following equation (12). Further, the heat flux $q_p$ per unit area from the plasma to the wafer W may be calculated from a difference between the heat generation amount $q_{h0}$, which is transferred from the heater HT, per unit area obtained from the heater power $P_{h0}$ (in the non-ignition state) when there is no heat flux from the plasma, and the heat generation amount $q_h$ from the heater HT per unit area obtained from the heater power $P_h$ in the steady state of the period T3, as expressed by the following equation (12).

$$q_p = (P_{h0} - P_h)/A = q_{h0} - q_h \quad (12)$$

Further, the graph of the temperature of the wafer W in the period T2 shown in FIG. 6A may also be modeled by taking the heat input amount from the plasma to the wafer W and the thermal resistance between the wafer W and the surface of the electrostatic chuck 18 as parameters. In the present embodiment, a change in the temperature of the wafer W in the period T2 is modeled as an equation based on unit area. For example, when $a_1$, $a_2$, $a_3$, $\lambda_1$, $\lambda_2$, $\tau_1$, and $\tau_2$ illustrated in the equations (5) to (11) are used by taking, for example, the heat flux $q_p$ and the thermal resistance $R_{th} \cdot A$ as parameters, a temperature $\tau_W$ [° C.] of the wafer W may be expressed by the following equation (13).

$$T_w = T_h + q_p \cdot (R_{th} \cdot A + R_{the} \cdot A) + \qquad (13)$$

$$\frac{q_P}{\rho_w \cdot C_w \cdot z_w \cdot (\lambda_1 - \lambda_2)} \left\{ \left(1 + \frac{a_2 + a_3}{a_1 \cdot a_3} \cdot \lambda_2\right) \exp\left(-\frac{t}{\tau_1}\right) - \left(1 + \frac{a_2 + a_3}{a_1 \cdot a_3} \cdot \lambda_1\right) \exp\left(-\frac{t}{\tau_2}\right) \right\}$$

Here, $\tau_W$ is the temperature [° C.] of the wafer W. $\tau_h$ is the temperature [° C.] of the heater HT that is controlled to be constant.

The temperature $\tau_h$ of the heater may be obtained from the conditions at the actual time of controlling the temperature of the wafer W to be constant.

When the heat flux $q_p$ and the thermal resistance $R_{th} \cdot A$ are obtained by fitting to the equation (1) using the measurement result, the temperature $\tau_W$ of the wafer W may be calculated from the equation (13).

When the elapsed time t is sufficiently longer than the time constants $\tau_1$ and $\tau_2$ expressed in the equations (10) and (11), the equation (13) may be omitted as in the following equation (14). That is, in a case of calculating the temperature $\tau_h$ of the heater HT when the temperature $\tau_W$ of the wafer W becomes a target temperature after transition to the steady state of the period T3 shown in FIGS. 6A and 6B, the equation (13) may be expressed as the following equation (14).

$$T_w = T_h + q_p \cdot (R_{th} \cdot A + R_{thc} \cdot A) \qquad (14)$$

For example, the temperature $T_W$ of the wafer W may be obtained from the temperature $T_h$ of the heater, the heat flux $q_p$, and the thermal resistances $R_{th} \cdot A$ and $R_{thc} \cdot A$ by the equation (14).

However, in the plasma processing apparatus 10, the plasma processing conditions may change due to an abnormality, an occurrence of a failure, a change with time, and the like. For example, in the plasma processing apparatus 10, the pressure in the processing chamber 12, the applied power in the plasma processing, and the like may change due to the abnormality, the occurrence of a failure, the change with time, and the like. The plasma processing condition may include the first high-frequency power from the first high-frequency power supply HFS, and the second high-frequency power from the second high-frequency power supply LFS. Further, the plasma processing condition may include the pressure in the processing chamber 12, the surface roughness of the mounting table 16, the pressure of the heat transfer gas, the film thickness of the rear surface of the wafer W, the warpage of the wafer W, the temperature of the upper electrode 30, and the temperature of the deposition shield 46. Further, the plasma processing conditions are not limited thereto, and the plasma processing conditions may include anything as long as the change occurs due to the abnormality, the occurrence of a failure, and the like.

In the plasma processing apparatus 10, when the plasma processing conditions changes, the heat input amount from the plasma, the heat input amount by the radiant heat, the thermal resistance between the wafer W and the surface of the electrostatic chuck 18, and the like are changed, a value for the temperature of the mounting table 16 is also changed. The value for the temperature of the mounting table 16 may include, for example, the heat generation amount of the heater HT for maintaining the temperature of the mounting table 16 at a predetermined temperature in the non-ignition state, the thermal resistance between the wafer W and the mounting table 16, and the heat input amount input to the mounting table 16 from the plasma in the ignition state.

Further, the value for the temperature of the mounting table 16 is not limited thereto, and may be any value as long as it is a value for the temperature of the mounting table 16 and a change occurs due to a change in the plasma processing condition.

For example, in the plasma processing apparatus 10, when the temperature of the upper electrode 30 and the temperature of the deposition shield 46 change, the heat input amount from the radiant heat to the wafer W changes. Due to this, the heater power $P_{h0}$ supplied to each heater HT in the non-ignition state changes, and the heat generation amount $q_{h0}$ from the heater HT per unit area changes. The heat generation amount $q_{h0}$ is obtained by dividing the heater power $P_{h0}$ by the area for each heater HT.

Figure 8A:
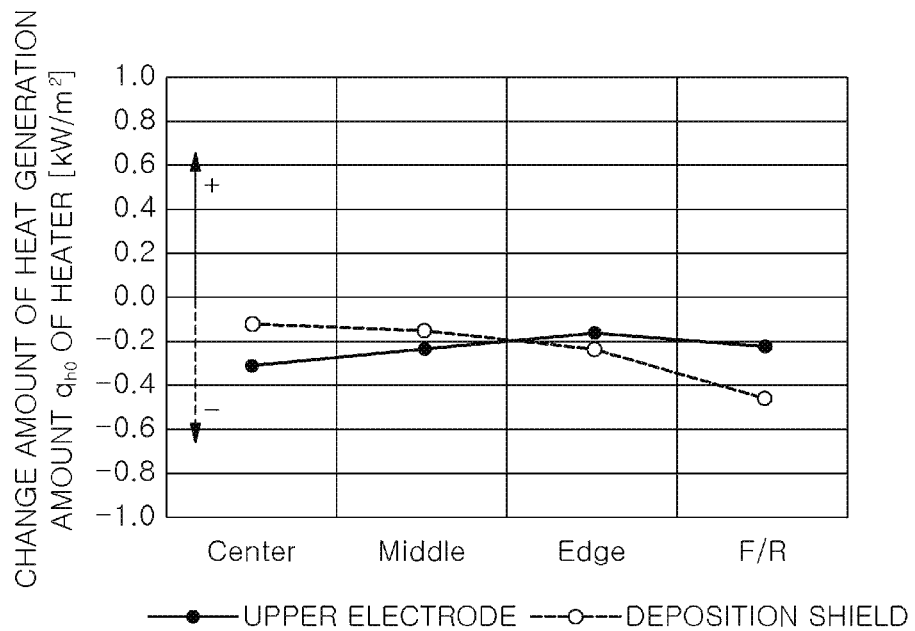
FIG. 8A shows an example of a change in an amount of heat generated from the heater when temperatures of an upper electrode and a deposition shield is changed.

FIG. 8A shows an example of a change in the heat generation amount $q_{h0}$ from the heater HT when the temperature of the upper electrode and the temperature of the deposition shield change. FIG. 8A illustrates a change in the heat generation amount $q_{h0}$ from the heater HT due to the heater power $P_{h0}$ supplied to the heater HT provided in each of division regions 75 of a center portion (Center), a middle portion (Middle), an edge portion (Edge), and a focus ring portion (F/R) in the non-ignition state of the plasma. A solid line denotes a change in the heat generation amount $q_{h0}$ from the heater HT when the temperature of the upper electrode 30 is changed from 40° C. to 120° C. A dashed line denotes the change in the heat generation amount $q_{h0}$ from the heater HT when a temperature of the deposition shield 46 is changed from 40° C. to 120° C. As described above, when the temperature of the upper electrode 30 and the temperature of the deposition shield 46 increase, the heat input amount from the radiant heat to the wafer W increases, and thus, the heat generation amount $q_{h0}$ from the heater HT is decreased. Further, as denoted by the solid line and the dashed line, the change in the temperature of each division region 75 in the upper electrode 30 is different from the change in the temperature of each division region 75 in the deposition shield 46. For example, the radiant heat from the upper electrode 30 is input from the upper portion of the mounting table 16. For this reason, when the temperature of the upper electrode 30 changes, the heat generation amount $q_{h0}$ from the heater HT greatly changes in a region around the central portion of a surface of the mounting table 16, such as the center portion and the middle portion. On the other hand, the radiant heat from the deposition shield 46 is input from a side surface of the mounting table 16. For this reason, when the temperature of the deposition shield 46 changes, the heat generation amount $q_{h0}$ from the heater HT greatly changes in a region around the peripheral portion of the surface of the mounting table 16, such as the edge portion and the focus ring portion.

Therefore, it is possible to specify which of the temperature of the upper electrode 30 and the deposition shield 46 has changed from the pattern of the change in the heat generation amount $q_{h0}$ from the heater HT in each division region 75.

Further, in the plasma processing apparatus 10, for example, when the first high-frequency power from the first high-frequency power supply HFS and the second high-frequency power from the second high-frequency power supply LFS are changed, the heat input amount from the plasma changes. Therefore, the heater power $P_h$ supplied to each heater HT changes, and the heat generation amount $q_h$ from the heater HT per unit area changes in the steady state in which the plasma is ignited. The heat generation amount $q_h$ is obtained by dividing the heater power $P_h$ by the area for each heater HT.

Figure 8B:
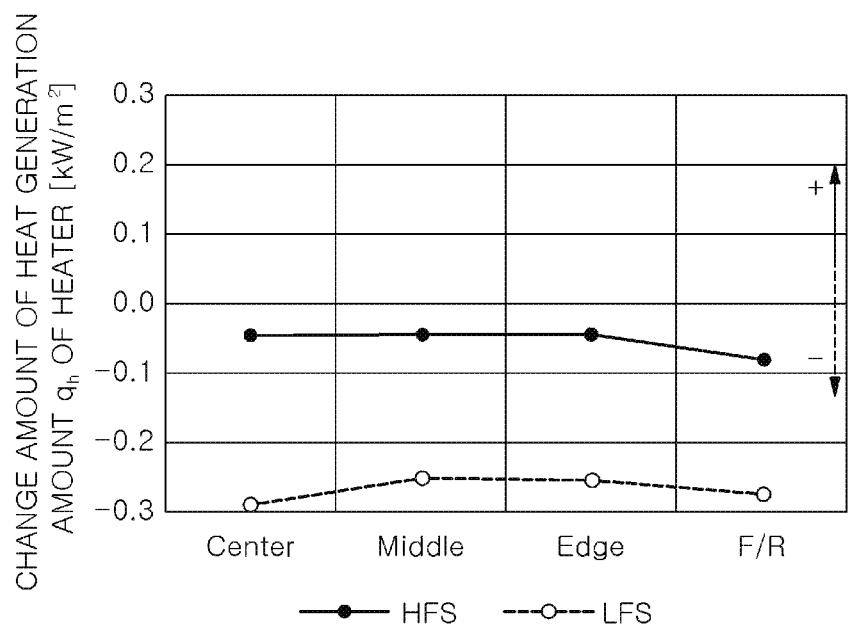
FIG. 8B shows an example of a change in an amount of heat generated from the heater when a first high-frequency power and a second high-frequency power are changed.

FIG. 8B shows an example of a change in the heat generation amount from the heater when the first high-frequency power and the second high-frequency power are changed. FIG. 8B illustrates a change in the heat generation amount $q_{h0}$ from the heater HT due to the heater power $P_{h0}$ supplied to the heater HT provided in each of division regions 75 of a center portion (Center), a middle portion (Middle), an edge portion (Edge), and a focus ring portion (F/R) in the steady state in which the plasma is ignited. A solid line denotes a change in the heat generation amount $q_h$ from the heater HT when the first high-frequency power is changed from 500 W to 1000 W. A dashed line illustrates a change in the heat generation amount $q_h$ from the heater HT when the second high-frequency power is changed from 500 W to 1000 W. As described above, when the first high-frequency power and the second high-frequency power are increased, the heat input amount from the plasma is increased, and thus, the heat generation amount $q_h$ from the heater HT is decreased. Further, as denoted by the solid line and the dashed line, the change in the temperature of each division region 75 due to a power change in the first high-frequency power is different from the change in the temperature of each division region 75 due to a power change in the second high-frequency power. For example, when the first high-frequency power is changed, the heat generation amount $q_h$ from the heater HT is greatly changed in a region around the peripheral portion of a surface of the mounting table 16 such as the focus ring portion. On the other hand, when the second high-frequency power is changed, the heat generation amount $q_h$ from the heater HT is greatly changed in a region around the central portion of the surface of the mounting table 16 such as the center portion and in a region around the peripheral portion of the surface of the mounting table 16 such as the focus ring portion.

Therefore, it is possible to specify which of the first high-frequency power and the second high-frequency power is changed from the pattern of the change in the heat generation amount $q_h$ of the heater HT in each division region 75.

Figure 8C:
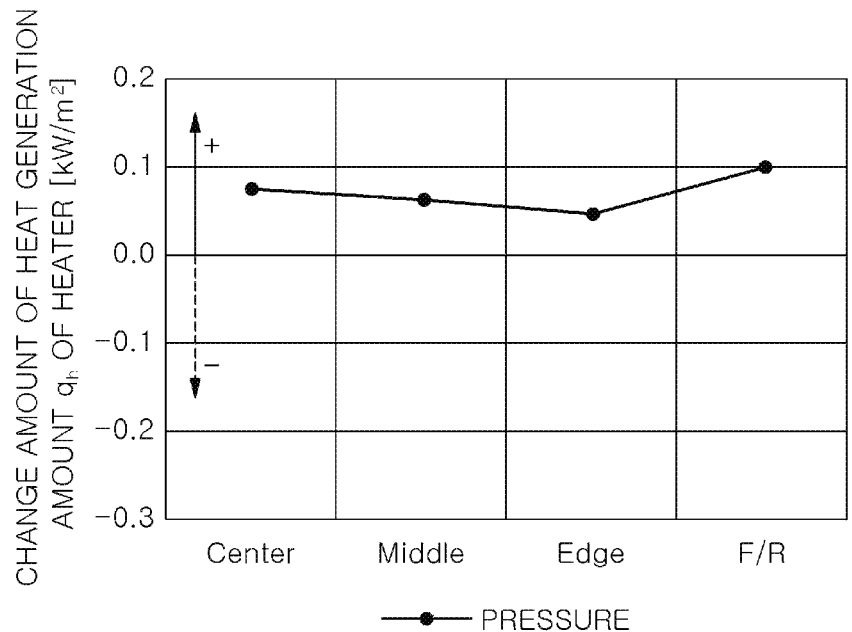
FIG. 8C shows an example of a change in an amount of heat generated from the heater when a pressure in a processing chamber is changed.

Further, in the plasma processing apparatus 10, for example, when the pressure in the processing chamber 12 is changed, the heat input amount from the plasma is changed. Therefore, the heater power $P_h$ supplied to each heater HT is changed, and the heat generation amount $q_h$ from the heater HT per unit area is changed in the steady state in which the plasma is ignited. The heat generation amount $q_h$ is obtained by dividing the heater power $P_h$ by an area for each heater HT. FIG. 8C shows an example of a change in the heat generation amount from the heater when the pressure in the processing chamber is changed. FIG. 8C illustrates a change in the heat generation amount $q_{h0}$ of the heater HT supplied to the heater HT provided in each of division regions 75 of a center portion (Center), a middle portion (Middle), an edge portion (Edge), and a focus ring portion (F/R) in the steady state in which the plasma is ignited. A solid line denotes the change in the heat generation amount $q_h$ from the heater HT when the pressure in the processing chamber 12 is changed from 30 mTorr to 50 mTorr.

Here, when the pressure in the processing chamber 12 increases, the heat input amount from the plasma decreases, and thereby, the heat generation amount $q_h$ from the heater HT increases. Further, when the pressure in the processing chamber 12 increases, the heat generation amount $q_h$ from the heater HT in a region around the peripheral portion of a surface of the mounting table 16 such as the focus ring portion is greatly changed. Therefore, it is possible to specify whether or not the pressure in the processing chamber 12 is changed from a change pattern of the heat generation amount $q_h$ of the heater HT in each division region 75.

Figure 8D:
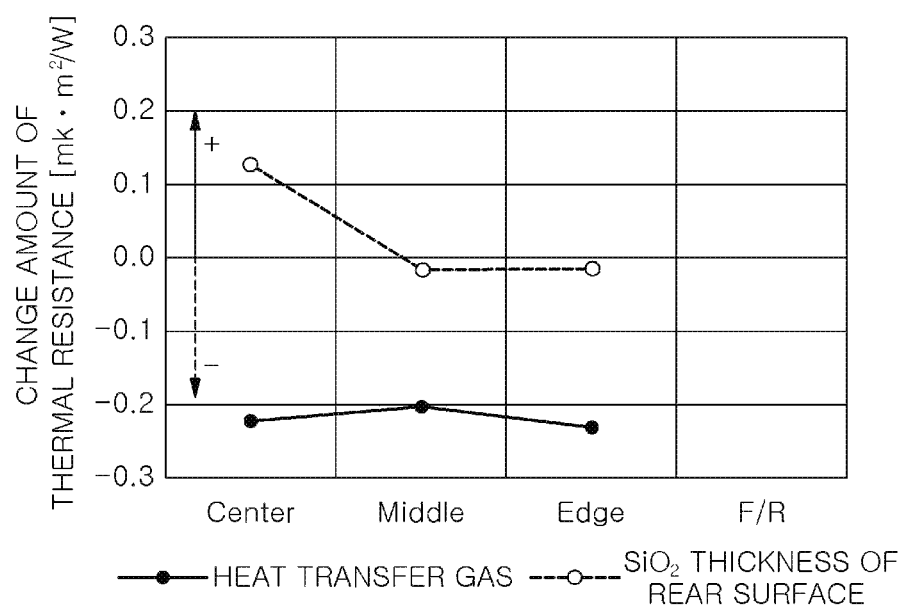
FIG. 8D shows an example of a change in a thermal resistance when a pressure of heat transfer gas and a thickness of a film on a rear surface of the wafer W are changed.

Further, in the plasma processing apparatus 10, for example, when the pressure of the heat transfer gas supplied between an upper surface of the electrostatic chuck 18 and a rear surface of the wafer W is changed, the thermal resistance between the wafer W and the rear surface of the electrostatic chuck 18 is changed. Further, in the plasma processing apparatus 10, when the film thickness of the rear surface of the wafer W is changed, the thermal resistance between the wafer W and the surface of the electrostatic chuck 18 is changed. FIG. 8D shows an example of a change in the thermal resistance when the pressure of the heat transfer gas and the film thickness of the rear surface of the wafer W are changed. FIG. 8D illustrates the change in the thermal resistance $R_{th} \cdot A$ of each of division regions 75 of a center portion (Center), a middle portion (Middle), an edge portion (Edge), and a focus ring portion (F/R). A solid line denotes the change in the thermal resistance when the pressure of the heat transfer gas supplied between the upper surface of the electrostatic chuck 18 and the rear surface of the wafer W is changed from 10 Torr to 30 Torr. A dashed line denotes the change in the thermal resistance when the film thickness of an $SiO_2$ layer of the rear surface of the wafer W is changed from 0 nm to 1000 nm.

Here, when the pressure of the heat transfer gas or the film thickness of the rear surface of the wafer W is increased, the thermal resistance is changed, and thereby, the heat input amount from the plasma is changed. Further, as denoted by the solid line and the dashed line, the change of the thermal resistance due to the change of the pressure of the heat transfer gas is different from the change of the thermal resistance due to the change of the film thickness of the rear surface of the wafer W. For example, when the pressure of the heat transfer gas is changed, the thermal resistance of a region around the central portion of the wafer W, such as the center portion (Center), is greatly changed. On the other hand, when the film thickness of the rear surface of the wafer W is changed, the thermal resistance is greatly changed in the whole region of the wafer W. Therefore, it is possible to specify whether or not the pressure of the heat transfer gas and/or the film thickness of the rear surface of the wafer W are changed from a change pattern of the thermal resistance of each division region 75.

Referring back to FIG. 3, the heater control unit 102a controls temperatures of the respective heaters HT. For example, the heater control unit 102a outputs, to the heater power supply HP, control data indicating a supply power to each heater HT to control the supply power supplied from the heater power supply HP to each heater HT, thereby controlling temperatures of the respective heaters HT.

At the time of the plasma processing, a target setting temperature of each heater HT is set in the heater control unit 102a. For example, a target temperature of the wafer W is set as the setting temperature of the heater HT for each division region 75 of the mounting region 18a in the heater control unit 102a. The target temperature of the wafer W may be a temperature at which the plasma etching accuracy for the wafer W is the best.

The heater control unit 102a controls the supply power to each heater HT such that each heater HT achieves the setting temperature at the time of the plasma processing. For example, the heater control unit 102a compares the temperature of each division region 75 of the mounting region 18a represented by the temperature data input to the external interface 101 with the setting temperature of the corresponding division region 75. This comparison is carried out for each division region 75. By using the comparison results, the heater control unit 102a specifies the division region 75 having a temperature lower than the setting temperature and the division region 75 having a temperature higher than the setting temperature. The heater control unit 102a outputs, to heater power supply HP, control data for increasing the supply power to the division region 75 having a temperature lower than the setting temperature and control data for reducing the supply power to the division region 75 having a temperature higher than the setting temperature.

The first acquisition unit 102b acquires change information 104a indicating a change in the temperature value of the mounting table 16 when plasma processing conditions change.

First, the wafer W is mounted on the mounting table 16 and the plasma processing is performed by using processing parameters, which are the plasma processing condition, as the standard condition. Then, the first acquisition unit 102b acquires a temperature value of the mounting table 16. The standard condition is, for example, a processing condition for performing actual plasma processing for the wafer W in a semiconductor manufacturing process. The first acquisition unit 102b acquires a temperature value of the mounting table 16 when the plasma processing is performed by using the processing condition as the standard condition.

At the time of the plasma processing, a target setting temperature of each heater HT is set in the heater control unit 102a. The heater control unit 102a controls the supply power to each heater HT such that each heater HT reaches the setting temperature at the time of the plasma processing.

The first acquisition unit 102b acquires the temperature value of the mounting table 16 when the plasma processing is performed while the supply power to each heater HT is controlled by the heater control unit 102a such that the temperature of each heater HT is constant. For example, the first acquisition unit 102b measures the supply power to each heater HT in a non-ignition state where the plasma is not ignited before the start of the plasma processing. Further, the first acquisition unit 102b measures the supply power to each heater HT in a transient state before the tendency of the supply power to each heater HT to decrease stabilizes such that the supply power to the heater HT becomes constant after the plasma is ignited. Further, after the plasma is ignited, the first acquisition unit 102b measures the supply power to each heater HT in a steady state where the decrease of the supply power to each heater HT is stopped and the supply power to the heater HT becomes constant. The supply power to each heater HT in the non-ignition state may be measured at least once in each heater HT, or an average of values obtained by measuring several times may be set as the supply power in the non-ignition state. The supply power to each heater HT in the transient state and the steady state may be measured twice or more. Further, the timing of measuring the supply power may include the timing when the tendency of the supply power to decrease is large. Further, when the number of times of measurement is small, the measurement timing may be separated by a predetermined period of time. In the present embodiment, the first acquisition unit 102b measures the supply power to each heater HT at a predetermined time interval (e.g., at an interval of 0.1 second) during the plasma processing. Therefore, the supply power to each heater HT in the transient state and the steady state is measured several times.

The first acquisition unit 102b measures the supply power to each heater HT in the non-ignition state, the transient state, and the steady state in a predetermined cycle.

The first acquisition unit 102b calculates the heat generation amount of each heater HT for maintaining the temperature of each heater HT at a predetermined temperature in the non-ignition state. For example, the first acquisition unit 102b calculates the heater power $P_{h0}$ in the non-ignition state for each heater from the supply power to the heater HT in the non-ignition state for each heater HT.

Further, the first acquisition unit 102b calculates, for each heater HT, the thermal resistance between the wafer W and the mounting table 16 and the heat input amount flowing into the mounting table 16 from the plasma in the ignition state. For example, the first acquisition unit 102b takes the heat input amount from the plasma and the thermal resistance between the wafer W and the heater HT as parameters for each heater HT, and performs, for each heater HT, fitting to a calculation model for calculating the supply power in the transient state by using the measured supply power in the non-ignition state and the transient state to calculate the heat input amount and the thermal resistance for each heater HT.

For example, the first acquisition unit 102b calculates the heater power $P_{h0}$ in the non-ignition state for each elapsed time t for each heater HT. Further, the first acquisition unit 102b calculates the heater power $P_h$ in the transient state for each elapsed time t for each heater HT. The first acquisition unit 102b calculates the heat generation amount $q_{h0}$ from the heater HT per unit area in the non-ignition state for each elapsed time t by dividing the calculated heater power $P_{h0}$ by an area for each heater HT. Further, the first acquisition unit 102b calculates the heat generation amount $q_h$ from the heater HT per unit area in the transient state for each elapsed time t by dividing the calculated heater power $P_h$ by the area for each heater HT.

In addition, the first acquisition unit 102b performs the fitting of the heat generation amount $q_h$ and the heat generation amount $q_{h0}$ for each elapsed time t for each heater HT by using the equations (1) to (11) as the calculation model, and calculates the heat flux $q_p$ and the thermal resistance $R_{th} \cdot A$ having the lowest degree of error.

Further, the first acquisition unit 102b may calculate the heat input amount from the plasma to the wafer W from the difference between the supply power in the non-ignition state and the supply power in the steady state. For example, the first acquisition unit 102b may calculate the heat flux $q_p$ by dividing the difference between the heater power $P_{h0}$ in the non-ignition state and the heater power $P_h$ in the steady state by the area for each heater HT by using the equation (12).

Next, the first acquisition unit 102b changes a processing parameter used as the plasma processing condition. For example, the first acquisition unit 102b changes any one of the processing parameters including the first high-frequency power, the second high-frequency power, a pressure of the heat transfer gas, a film thickness of a rear surface of the wafer W, a temperature of the upper electrode 30, and a temperature of the deposition shield 46. Further, although it is preferable to change the processing parameters one by one, two or more processing parameters may be changed simultaneously.

A new wafer W is mounted on the mounting table 16, and the first acquisition unit 102b acquires a temperature value of the mounting table 16 when the plasma processing is performed on the changed processing condition. For example, while the heater control unit 102a controls the supply power to each heater HT such that the temperature of each heater HT becomes a constant setting temperature, the acquisition unit 102a measures the supply power to each heater HT in the non-ignition, the transient state, and the steady state of the plasma processing.

The first acquisition unit 102b calculates the heater power $P_{h0}$ in the non-ignition state for each heater HT from the supply power to the heater HT in the non-ignition state for each heater HT as a heat generation amount in the heater HT for maintaining the temperature of the heater HT at a predetermined temperature in the non-ignition state. Further, the first acquisition unit 102b performs the fitting to the above-described calculation model by using the measured power supply in the non-ignition state and the transient state to thereby calculate the heat input amount to the wafer W and the thermal resistance for each heater HT. Further, the first acquisition unit 102b may calculate the heat input amount from the plasma to the wafer W from a difference between the supply power in the non-ignition state and the supply power in the steady state.

The first acquisition unit 102b acquires the temperature value of the mounting table 16 by changing the processing parameters that are the plasma processing conditions in a predetermined range, respectively. For example, the first acquisition unit 102b calculates the heater power $P_{h0}$, the heat flux $q_p$, and the thermal resistance $R_{th} \cdot A$ by changing the respective processing parameters that are the plasma processing conditions in a predetermined range. In addition, the first acquisition unit 102b generates the change information 104a indicating a change of the temperature value of the mounting table 16 when the plasma processing condition is changed. For example, the first acquisition unit 102b generates the change information 104a in which a change pattern of the temperature value of the mounting table 16 of each division region 75 is recorded for each of the changed processing parameters that are the plasma processing conditions. For example, the first acquisition unit 102b generates the change information 104a in which the change pattern indicating changes of the heater power $P_{h0}$, the heat flux $q_p$, and the thermal resistance $R_{th} \cdot A$ of each division region 75 when the first high-frequency power, the second high-frequency power, the pressure of the heat transfer gas, the film thickness of the rear surface of the wafer W, the temperature of the upper electrode 30, and the temperature of the deposition shield 46 are changed. The change information 104a may include the heater power $P_{h0}$, the heat flux $q_p$, and the thermal resistance $R_{th} \cdot A$ for each processing condition. Further, the heater power $P_{h0}$, the heat flux $q_p$, and the thermal resistance $R_{th} \cdot A$ at any one of the processing conditions may be set as a reference processing condition, and the change information 104a may include the difference of the heater power $P_{h0}$, the heat flux $q_p$, and the thermal resistance $R_{th} \cdot A$ between the reference processing condition and the other processing conditions. The first acquisition unit 102b may store the generated change information 104a in the storage unit 104.

Accordingly, the change information 104a is stored in the storage unit 104. Further, in the present embodiment, the case where the first acquisition unit 102b acquires the change information 104a when the plasma processing is performed while the processing condition is changed is described as an example, and the present disclosure is not limited thereto. The storage unit 104 may store change information 104a prepared in advance or change information 104a generated by another device.

Meanwhile, as described above, the plasma processing apparatus 10 may have a change in the plasma processing condition due to an abnormality, an occurrence of a failure, a change with time, and the like. Therefore, when the plasma processing is performed for the wafer W in a semiconductor manufacturing process, the plasma processing apparatus 10 according to the embodiment monitors a change in the plasma processing condition based on the change information 104a stored in the storage unit 104.

At the time of the plasma processing, a target setting temperature of each heater HT is set in the heater control unit 102a. The heater control unit 102a controls the supply power to each heater HT such that each heater HT reaches the setting temperature at the time of the plasma processing.

The second acquisition unit 102c acquires a temperature value of the mounting table 16 when the plasma processing is performed while the heater control unit 102a controls the supply power to each heater HT such that the temperature of each heater HT is the constant setting temperature. For example, the second acquisition unit 102c measures the supply power to each heater HT in a non-ignition state in which the plasma is not ignited before the start of the plasma processing. Further, the second acquisition unit 102c measures the supply power to each heater HT in a transient state before the tendency of the supply power to each heater HT to decrease stabilizes such that the supply power to the heater HT becomes constant after the plasma is ignited. Further, after the plasma is ignited, the second acquisition unit 102c measures the supply power to each heater HT in a stable steady state where the decrease of the supply power to each heater HT is stopped and the supply power to the heater HT becomes constant after the plasma is ignited. The supply power to each heater HT in the non-ignition state may be measured at least once in each heater HT, or an average of values obtained by measuring several times may be set as the supply power in the non-ignition state. The supply power to each heater HT in the transient state and the steady state may be measured twice or more. Further, the timing of measuring the supply power may include the timing when the tendency of the supply power to decrease is large. Further, when the number of times of measurement is small, the measurement timing may be separated by a predetermined period of time. In the present embodiment, the second acquisition unit 102c measures the supply power to each heater HT at a predetermined time interval (e.g., at an interval of 0.1 second) during the plasma processing. Therefore, the supply power to each heater HT in the transient state and the steady state is measured several times.

The second acquisition unit 102c measures the supply power to each heater HT in the non-ignition state, the transient state, and the steady state in a predetermined cycle. For example, the second acquisition unit 102c measures the supply power to each heater HT in the non-ignition state, the transient state, and the steady state whenever the wafer W is exchanged and the wafer W is mounted on the mounting table 16 to be subjected to the plasma processing. Further, for example, the second acquisition unit 102c may measure the supply power to each heater HT in the non-ignition state, the transient state, and the steady state for each plasma processing.

The second acquisition unit 102c calculates the heat generation amount of each heater HT in order to maintain the temperature of each heater HT at a predetermined temperature in the non-ignition state. For example, the second acquisition unit 102c calculates the heater power $P_{h0}$ in the non-ignition state for each heater HT from the supply power to the heater HT in the non-ignition state for each heater HT.

Further, the second acquisition unit 102c calculates, for each heater HT, the thermal resistance between the wafer W and the mounting table 16 and the heat input amount flowing into the mounting table 16 from the plasma in the ignition state. For example, the second acquisition unit 102c performs, for each heater HT, fitting to the calculated model described above by using the measured supply power in the non-ignition state and the transient state to thereby calculate the heat input amount and the thermal resistance for each heater HT.

For example, the second acquisition unit 102c obtains the heater power $P_{h0}$ in the non-ignition state for each elapsed time t for each heater HT. Further, the second acquisition unit 102c obtains the heater power $P_h$ in the transient state for each elapsed time t for each heater HT. The second acquisition unit 102c obtains the heat generation amount $q_{h0}$ from the heater HT per unit area in the non-ignition state for each elapsed time t by dividing the obtained heater power $P_{h0}$ by an area for each heater HT. Further, the second acquisition unit 102c obtains the heat generation amount $q_h$ from the heater HT per unit area in the transient state for each elapsed time t by dividing the obtained heater power $P_h$ by the area for each heater HT.

In addition, the second acquisition unit 102c performs fitting of the heat generation amount $q_h$ and heat generation amount $q_{h0}$ for each elapsed time t for each heater HT by using the equations (1) to (11) as the calculation model, and calculates the heat flux $q_p$ and the thermal resistance $R_{th} \cdot A$ having the lowest degree of error.

Further, the second acquisition unit 102c may calculate the heat input amount from the plasma to the wafer W from the difference between the supply power in the non-ignition state and the supply power in the steady state. For example, the first acquisition unit 102b may calculate the heat flux $q_p$ by dividing the difference between the heater power $P_{h0}$ in the non-ignition state and the heater power $P_h$ in the steady state by the area of each heater HT by using the equation (12).

The second acquisition unit 102c calculates the heater power $P_{h0}$, the heat flux $q_p$, and the thermal resistance $R_{th} \cdot A$ in the non-ignition state in a predetermined cycle. For example, whenever the wafer W is exchanged, the second acquisition unit 102c calculates the heater power $P_{h0}$, the heat flux $q_p$, and the thermal resistance $R_{th} \cdot A$ in the non-ignition state by using the supply power, which is measured in the non-ignition state, the transient state, and the steady state while the wafer W is mounted on the mounting table 16.

The setting temperature calculation unit 102d calculates a setting temperature of each heater HT that makes the wafer W reach a target temperature by using the calculated heat input amount and thermal resistance. For example, the setting temperature calculation unit 102d inserts the calculated heat flux $q_p$ and the thermal resistance $R_{th} \cdot A$ into the equations (5), (6), and (13), and calculates the temperature $\tau_h$ of each heater HT from the equation (13) by using $a_1$, $a_2$, $a_3$, $\lambda_1$, $\lambda_{2f} \tau_1$, and $\tau_2$ expressed in the equations (5) to (11). For example, the setting temperature calculation unit 102d calculates the temperature $\tau_h$ of each heater HT by setting the elapsed time t as a predetermined value large enough to be regarded as the steady state. The calculated temperature $\tau_h$ of each heater HT is the temperature of the heater HT that makes the temperature of the wafer W reach a target temperature. Further, the temperature $\tau_h$ of each heater HT may be obtained from the equation (14).

In addition, the setting temperature calculation unit 102d may calculate, for each heater HT, the temperature $\tau_W$ of the wafer W at the temperature T of the current heater HT from the equation (13). For example, the setting temperature calculation unit 102d calculates, for each heater HT, the temperature $\tau_W$ of the wafer W when the elapsed time t is set to a predetermined value large enough to be regarded as the steady state at the temperature T of the current heater HT. Next, the setting temperature calculation unit 102d calculates a difference $\Delta T_W$ between the calculated temperature $T_W$ and a target temperature. In addition, the setting temperature calculation unit 102d may calculate the temperature obtained by subtracting the difference $\Delta T_W$ from the temperature T of the current heater HT as the temperature $\tau_h$ of the heater HT that makes the temperature of the wafer W reach the target temperature.

The setting temperature calculation unit 102d corrects the setting temperature of each heater HT set in the heater control unit 102a to a temperature of the heater HT that makes the temperature of the wafer W reach the target temperature.

The setting temperature calculation unit 102d calculates, for each heater HT, the temperature of the heater HT that makes the temperature of the wafer W reach the target temperature and corrects the setting temperature of each heater HT in a predetermined cycle. For example, the setting temperature calculation unit 102d calculates the temperature of the heater HT that makes the temperature of the wafer W reach the target temperature and corrects the setting temperature of each heater HT whenever the wafer W is exchanged. In addition, for example, the setting temperature calculating unit 102d may calculate the temperature of the heater HT that makes the temperature of the wafer W reach the target temperature and correct the setting temperature of each heater HT for each plasma processing.

Therefore, the plasma processing apparatus 10 according to the present embodiment may accurately control the temperature of the wafer W in plasma processing to the target temperature.

However, as described above, in the plasma processing apparatus 10, the plasma processing condition may change due to an abnormality, an occurrence of a failure, a change with time, and the like.

Therefore, the monitoring unit 102e monitors a change in the plasma processing condition from the change in a temperature value of the mounting table 16 acquired by the second acquisition unit, based on the change information 104a. For example, the monitoring unit 102e stores the heater power $P_{h0}$, the heat flux $q_p$, and the thermal resistance $R_{th} \cdot A$ that are calculated by the second acquisition unit in the non-ignition state of each heater HT in a predetermined cycle. In addition, the monitoring unit 102e monitors whether or not a change in any change pattern among the change patterns stored in the change information 104a occurs in the heater power $P_{h0}$, the heat flux $q_p$, and the thermal resistance $R_{th} \cdot A$ of each heater HT.

For example, the monitoring unit 102e compares the heater power $P_{h0}$, the heat flux $q_p$, and the thermal resistance $R_{th} \cdot A$ of each heater HT calculated for the first wafer W with the heater power $P_{h0}$, the heat flux $q_p$, and the thermal resistance $R_{th} \cdot A$ of each heater HT calculated for the latest wafer W. In addition, the monitoring unit 102e obtains a change in the heater power $P_{h0}$, the heat flux $q_p$, and the thermal resistance $R_{th} \cdot A$ for each heater HT of each of the first wafer W and the latest wafer W. The monitoring unit 102e determines whether the change in the heater power $P_{h0}$, the heat flux $q_p$, and the thermal resistance $R_{th} \cdot A$ for each heater HT corresponds to a change in any change pattern stored in the change information 104a.

For example, the monitoring unit 102e determines whether or not a change in any one of the heater power $P_{h0}$, the heat flux $q_p$, and the thermal resistance $R_{th} \cdot A$ for each heater HT exceeds a predetermined allowable value. When the change exceeds the predetermined allowable value, the monitoring unit 102e compares the change pattern of such change in the heater power $P_{hO}$, the heat flux $q_p$, and the thermal resistance $R_{th} \cdot A$ for each heater HT with the change patterns stored in the change information 104a, and, specifies a similar change pattern. For example, based on the comparison result, the monitoring unit 102e specifies a change pattern in which a difference of any one of the heater power $P_{hO}$, the heat flux $q_p$, and the thermal resistance $R_{th} \cdot A$ between the respective division regions 75 is within an allowable value.

Alternatively, the monitoring unit 102e may specify multiple change patterns. When the multiple change patterns are specified, the monitoring unit 102e may specify one change pattern having the smallest difference. The monitoring unit 102e specifies processing parameters that are changed in the specified change pattern as the changed plasma processing condition.

The alarm unit 102f issues an alarm when a predetermined degree of change is detected in the plasma processing condition as a monitoring result of the monitoring unit 102e. For example, the alarm unit 102f issues the alarm when a change in any one of the heater power $P_{hO}$, the heat flux $q_p$, and the thermal resistance $R_{th} \cdot A$ for each heater HT exceeds a predetermined allowable value based on the monitoring result of the monitoring unit 102e. Further, the alarm unit 102f issues an alarm informing of the processing parameter specified by the monitoring unit 102e as the changed plasma processing condition. Further, when the multiple change patterns are specified, the alarm unit 102f issues an alarm informing of the processing parameter that is changed in each change pattern as the changed plasma processing condition. The alarm may be in any manner as long as a process manager, an operator of the plasma processing apparatus 10, or the like can be informed. For example, the alarm unit 102f displays a message informing the user interface 103 of the abnormality.

Accordingly, the plasma processing apparatus 10 according to the present embodiment may inform of the occurrence of an abnormality when the plasma processing condition changes due to an abnormality, an occurrence of a failure, a change with time, and the like. Further, the plasma processing apparatus 10 may inform of the processing parameter having the abnormality. Therefore, the process manager or the operator of the plasma processing apparatus 10 may be informed of the occurrence of an abnormality or a failure, and the occurrence of a change with time. Further, the process manager and the operator of the plasma processing apparatus 10 may estimate the parts that require maintenance from the processing parameters thus informed and restore the plasma processing apparatus 10 in early stages.

When a predetermined degree of change is detected in the plasma processing condition as a monitoring result of the monitoring unit 102e, the correction unit 102g corrects the plasma processing condition so as to eliminate the change in the detected processing condition. For example, the correction unit 102g corrects the value of the processing parameter specified by the monitoring unit 102e by the value of the change in the detected processing condition.

Therefore, the plasma processing apparatus 10 according to the present embodiment is capable of automatically correcting the changed processing condition to the original state when the plasma processing condition is changed due to an abnormality, an occurrence of a failure, a change with time, or the like.

<Flow of Processing>

Next, a flow of processing performed by the plasma processing apparatus 10 according to the present embodiment will be described. First, the flow of generation processing in which the plasma processing apparatus 10 generates the change information 104a will be described. FIG. 9 is a flowchart illustrating an example of the flow of the generation processing according to the embodiment. The generation processing is performed at, for example, a predetermined timing when a predetermined operation for instructing the start of the generation processing is performed by the user interface 103.

The heater control unit 102a controls a supply power to each heater HT such that each heater HT reaches a setting temperature (step S10).

The first acquisition unit 102b acquires a value for the temperature of the mounting table 16 when plasma processing is performed by setting and using processing parameters, which are a processing condition of the plasma processing, as the standard condition (step S11).

The first acquisition unit 102b determines whether or not the plasma processing is performed under all the processing conditions in which each of the processing parameters is changed within a predetermined range (step S12). When the plasma processing is performed under all the processing conditions (YES in step S12), the flow proceeds to step S15, which will be described below.

Meanwhile, when the plasma processing is not performed under all the processing conditions (NO in step S12), the first acquisition unit 102b changes the processing conditions to the processing condition not yet performed (step S13). The first acquisition unit 102b acquires the value for the temperature of the mounting table 16 when the plasma processing is performed under the changed processing condition (step S14) and proceeding to step S12 described above.

From the acquired values for the temperature of the mounting table 16 under the respective processing conditions, the first acquisition unit 102b generates the change information 104a indicating a change in the value for the temperature of the mounting table 16 when the processing condition is changed (step S15). The first acquisition unit 102b stores the generated change information 104a in the storage unit 104 (step S16) and terminates the processing.

Figure 10:
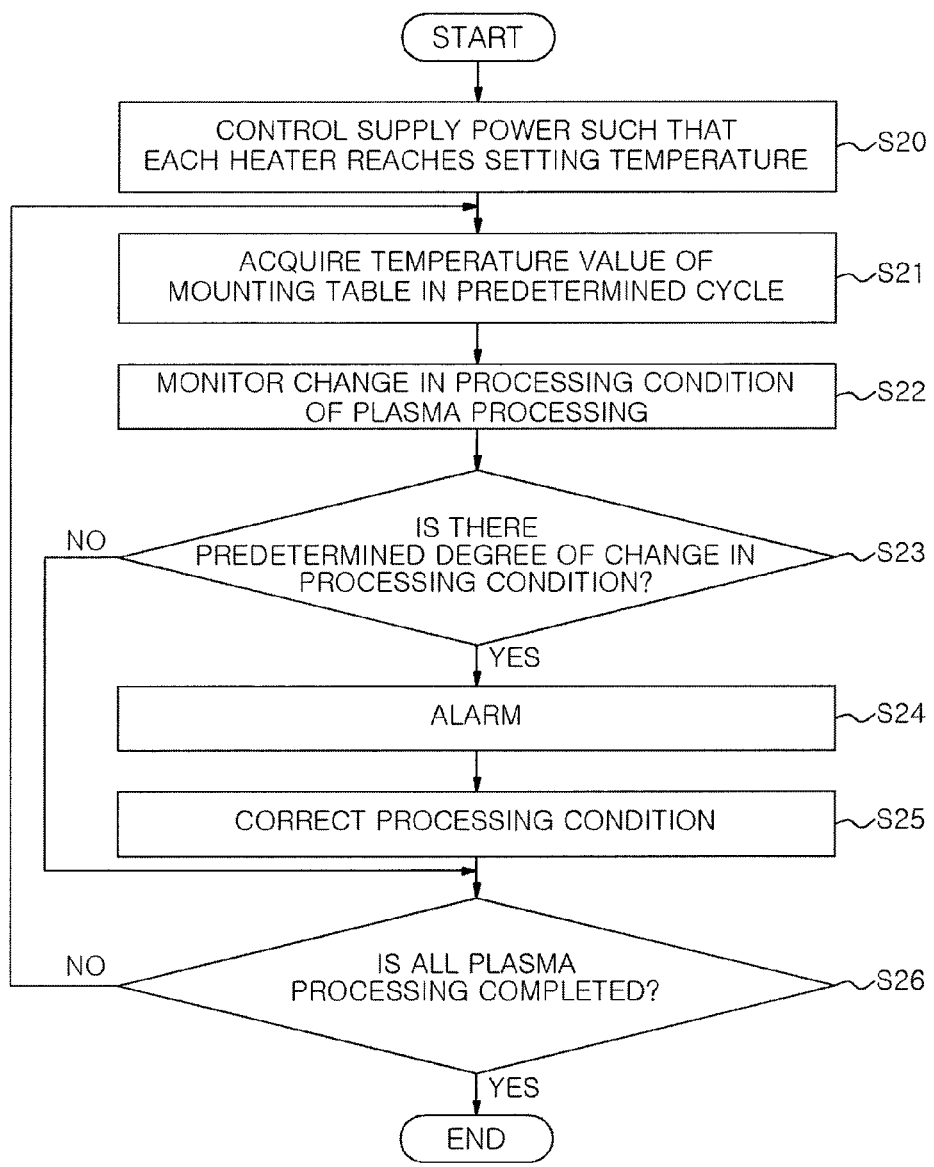
FIG. 10 is a flowchart showing an example of a flow of a monitoring processing according to the embodiment.

Next, a flow of monitoring processing in which the plasma processing apparatus 10 monitors the occurrence of an abnormality will be described. FIG. 10 is a flowchart showing an example of the flow of the monitoring processing according to the embodiment. The monitoring processing is performed at, for example, a predetermined timing when the plasma processing in a semiconductor manufacturing process is started.

The heater control unit 102a controls a supply power to each heater HT such that each heater HT reaches the setting temperature (step S20).

At the time of the plasma processing, the second acquisition unit 102c acquires the value for the temperature of the mounting table 16 in a predetermined cycle (step S21).

The monitoring unit 102e monitors, based on the change information 104a, a change in the processing condition of the plasma processing from the change in the value for the temperature of the mounting table 16 acquired by the second acquisition unit (step S22).

The alarm unit 102f determines whether or not a predetermined degree of change is detected in the processing condition of the plasma processing as a monitoring result of the monitoring unit 102e (step S23). When no change is detected (NO in step S23), the flow proceeds to step S26, which will be described below.

On the other hand, when the predetermined degree of change is detected (YES in step S23), the alarm unit 102f issues an alarm (step S24). The correction unit 102g corrects the processing condition of the plasma processing so as to eliminate the change in the detected processing condition (step S25).

The monitoring unit 102e determines whether or not all the plasma processing of the manufacturing process is completed (step S26). When all the plasma processing of the manufacturing process is not completed (NO in step S26), the flow proceeds to step S21 described above.

On the other hand, when all the plasma processing of the manufacturing process is completed (YES in step S26), the processing is terminated.

As described above, the plasma processing apparatus 10 according to the present embodiment includes the storage unit 104, the second acquisition unit 102c, and the monitoring unit 102e. The storage unit 104 stores the change information 104a indicating a change in the value for the temperature of the mounting table 16 when the processing condition of the plasma processing for the wafer W mounted on the mounting table 16 is changed. The second acquisition unit 102c acquires the value for the temperature of the mounting table 16 in a predetermined cycle. The monitoring unit 102e monitors, based on the change information 104a, a change in the processing condition of the plasma processing from the change in the value for the temperature of the mounting table 16 acquired by the second acquisition unit 102c. Therefore, the plasma processing apparatus 10 is capable of detecting an occurrence of an abnormality without a sensor disposed therefor.

Further, in the plasma processing apparatus 10 according to the present embodiment, the heater HT capable of adjusting the temperature of a mounting surface on which the wafer W is mounted is provided in the mounting table 16. The value for the temperature of the mounting table includes at least one of a heat generation amount of the heater HT for maintaining the temperature of the mounting table 16 at a predetermined temperature in a non-ignition state, the thermal resistance between the wafer W and the mounting table 16, and the heat input amount flowing into the mounting table 16 from the plasma in an ignition state. Therefore, the plasma processing apparatus 10 is capable of detecting the occurrence of an abnormality without a sensor disposed therefor.

Further, while the supply power to the heater HT is controlled such that the temperature of the heater HT is constant, the second acquisition unit 102c measures the supply power in the non-ignition state in which the plasma is not ignited and the supply power in the transient state in which the supply power to the heater HT is decreased after the plasma is ignited. In addition, the second acquisition unit 102c takes the heat input amount flowing into the mounting table 16 from the plasma and the thermal resistance between the wafer W and the mounting table 16 as parameters, and calculates the heat input amount and the thermal resistance by performing fitting to a calculation model for calculating the supply power in the transient state by using the measured supply power in the non-ignition state and the measured supply power in the transient state. Therefore, the plasma processing apparatus 10 is capable of acquiring the heat input amount and the thermal resistance without a sensor disposed therefor.

Further, while the supply power to the heater HT is controlled such that the temperature of the heater HT is constant, the second acquisition unit 102c measures the supply power in the non-ignition state in which the plasma is not ignited and the supply power in the steady state in which the plasma is ignited and the supply power to the heater HT is stable. The second acquisition unit 102c calculates the heat input amount from a difference between the measured supply power in the non-ignition state and the measured supply power in the steady state. Therefore, the plasma processing apparatus 10 is capable of acquiring the heat input amount without a sensor disposed therefor.

Further, in the state in which the power supply to the heater HT is controlled such that the temperature of the heater HT is constant, the second acquisition unit 102c measures the supply power in the non-ignition state in which the plasma is not ignited. Further, the second acquisition unit 102c calculates the heat generation amount of the heater HT for maintaining the temperature of the mounting table 16 at a predetermined temperature in the non-ignition state from the measured supply power in the non-ignition state. Therefore, the plasma processing apparatus 10 is capable of acquiring the heat generation amount of the heater HT without a sensor disposed therefor.

In addition, in the mounting table 16, a mounting surface on which the wafer W is mounted is divided into multiple division regions 75 and heaters HT are provided in the respective multiple division regions 75. A change pattern of a value for a temperature of the mounting table of each division region 75 is stored in the change information 104a whenever the processing parameters, which are a processing condition of the plasma processing, are changed. The second acquisition unit 102c acquires the value for the temperature of the mounting table 16 of each division region 75. The monitoring unit 102e specifies, based on the change information 104a, the changed processing parameters from the change pattern of the value for the temperature of the mounting table 16 of each division region 75 acquired by the second acquisition unit 102c. Therefore, the plasma processing apparatus 10 is capable of specifying the changed processing parameters without disposing a sensor.

Further, the plasma processing apparatus 10 further includes the alarm unit 102f. The alarm unit 102f issues an alarm when a predetermined degree of change is detected in the processing condition of the plasma processing as a monitoring result obtained by the monitoring unit 102e. Therefore, the plasma processing apparatus 10 can issue the alarm when the predetermined change of the processing conditions of the plasma processing occurs or the change exceeds the predetermined change.

In addition, the plasma processing apparatus 10 further includes the correction unit 102g. The correction unit 102g corrects the processing condition of the plasma processing so as to eliminate a change in the processing condition when a predetermined degree of change is detected in the processing condition of the plasma processing as a monitoring result obtained by the monitoring unit 102e. Therefore, the plasma processing apparatus 10 is capable of automatically correcting the processing condition of the changed plasma processing.

Although the embodiments have been described, the embodiments disclosed herein are considered to be illustrative and are not restrictive in all aspects. Various modifications may be made without departing from the scope and spirit of the present disclosure. Further, the above-described embodiments may be omitted, replaced, or changed variously without departing from the scope and the gist of the following claims.

For example, in the above-described embodiments, a semiconductor wafer is described as an example of a target object on which the plasma processing is performed. However, the present disclosure is not limited thereto. For example, the target object may be any object as long as it affects the progress of the plasma processing by temperature.

Further, in the above-described embodiments, the case where both an issuance of an alarm made by the alarm unit 102f and correction of the processing condition made by the correction unit 102g are performed is described as an example. However, the present disclosure is not limited thereto. For example, the plasma processing apparatus 10 may perform only one of the issuance of the alarm made by the alarm unit 102f and the correction of the processing conditions made by the correction unit 102g.

Figure 11A:
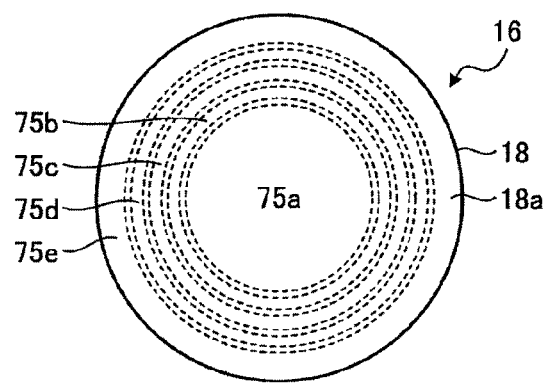
FIG. 11A is a plan view showing a mounting table according to another embodiment.

Further, in the above-described embodiments, the case where the mounting region 18a of the electrostatic chuck 18 is divided into four division regions 75 at substantially equal intervals in a radial direction is described as an example as illustrated in FIG. 2. However, the present disclosure is not limited thereto. For example, the mounting region 18a of the electrostatic chuck 18 may be divided into multiple division regions 75 having a large interval at the center region of the wafer W and a small interval at the outer circumferential region of the wafer W. FIG. 11A is a plan view showing a mounting table according to another embodiment. In FIG. 11A, a mounting region 18a of the electrostatic chuck 18 is divided into a central circular division region 75a and four annular division regions 75b to 75e. The wafer W is disposed on the division regions 75a to 75d. A focus ring FR is disposed on the division region 75e. Further, the division region 75a corresponding to a central region of the wafer W has a large width. The division regions 75b to 75d corresponding to an outer circumferential region of the wafer W have small widths.

Figure 11B:
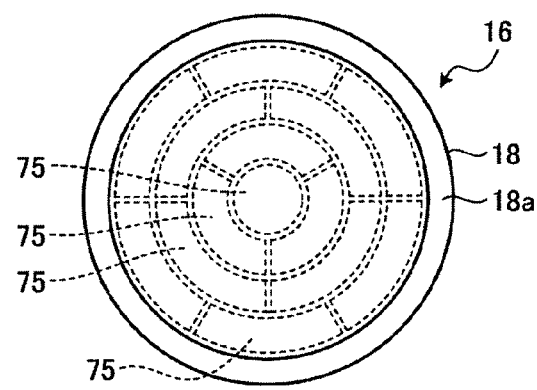
FIG. 11B is a plan view showing a mounting table according to still another embodiment.

Alternatively, the mounting region 18a of the electrostatic chuck 18 may be divided in a circumferential direction. FIG. 11B is a plan view showing the mounting table according to still another embodiment. In FIG. 11B, the mounting region 18a is divided into a central circular division region 75 and concentric annular division regions surrounding the circular division region 75. Further, the annular division region is divided into division regions 75 in the circumferential direction.

Figure 11C:
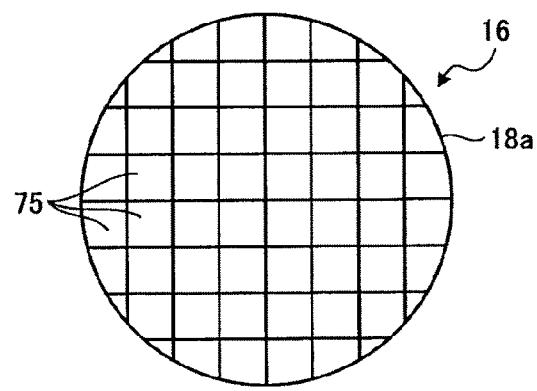
FIG. 11C is a plan view showing a mounting table according to still another embodiment.

Further, a shape of the division region 75 may be other than a circular shape or an annular shape. FIG. 11C is a plan view showing a mounting table according to still another embodiment. In FIG. 11C, the mounting region 18a is divided into division regions 75 of a lattice shape.

Further, in the above-described embodiments, the case where a change in a processing condition of plasma processing is monitored by acquiring a value for a temperature of the mounting table 16 is acquired for each division region 75 obtained by dividing the mounting region 18a of the electrostatic chuck 18 is described as an example. However, the present disclosure is not limited thereto. For example, the plasma processing apparatus 10 may acquire one value for the temperature of the mounting table 16 in the entire mounting region 18a of the electrostatic chuck 18 and monitor the change in the processing condition of the plasma processing from the change in the acquired value. Alternatively, the plasma processing apparatus 10 may acquire the value for the temperature of the mounting table 16 for any one division region 75 and monitor the change in the processing condition of the plasma processing from the change in the acquired value.

Further, in the above-described embodiments, the case where plasma etching is performed as the plasma processing is described as an example, the present disclosure is not limited thereto. The plasma processing may be any plasma processing as long as plasma is used and the progress of the processing is affected by temperature.

The invention claimed is:

1. A plasma processing apparatus comprising:
a storage unit configured to store change information indicating a change in a value for a temperature of a mounting table when a processing condition of plasma processing for a target object mounted on the ting table is changed;
an acquisition unit configured to acquire the value for the temperature of the mounting table in a predetermined cycle; and
a monitoring unit configured to monitor, based on the change information, a change in the processing condition of the plasma processing from the change in the value for the temperature of the mounting table acquired by the acquisition unit.

2. The plasma processing apparatus of claim 1,
wherein the mounting table is provided with a heater by which a temperature of a mounting surface on which the target object is mounted is adjusted, and
wherein the value for the temperature of the mounting table includes at least one of a heat generation amount of the heater for maintaining the temperature of the mounting table at a predetermined temperature in a non-ignition state in which plasma is not ignited, a thermal resistance between the target object and the mounting table, and a heat input amount flowing from the plasma into the mounting table in an ignition state in which the plasma is ignited.

3. The plasma processing apparatus of claim 2, wherein, while a supply power to the heater is controlled such that a temperature of the heater is constant, the acquisition unit calculates the heat input amount and the thermal resistance by measuring the supply power in the non-ignition state and the supply power in a transient state in which the supply power to the heater is decreased after the plasma is ignited, taking the heat input amount flowing into the mounting table from the plasma and the thermal resistance between the target object and the mounting table as perimeters, performing fitting to a calculation model for calculating the supply power in the transient state by using the measured supply power in the non-ignition state and the measured supply power in the transient state.

4. The plasma processing apparatus of claim 2, wherein, while a supply power to the heater is controlled such that a temperature of the heater is constant, the acquisition unit measures the supply power in the non-ignition state and the supply power in a steady state in which the supply power to the heater is stable by igniting the plasma, and calculates the heat input amount from a difference between the measured supply power in the non-ignition state and the measured supply power in the steady state.

5. The plasma processing apparatus of claim 2, wherein, while a supply power to the heater is controlled such that a temperature of the heater is constant, the acquisition unit measures the supply power in the non-ignition state, and calculates the heat generation amount of the heater for maintaining the temperature of the mounting table at a predetermined temperature in the non-ignition state from the measured supply power in the non-ignition state.

6. The plasma processing apparatus of claim 2,
wherein, in the mounting table, the mounting surface on which the target object is mounted is divided into multiple division regions, and the heater is provided in each of the multiple division regions,
a change pattern of a value for a temperature of the mounting table at each of the multiple division regions is stored in the change information whenever processing parameters of the processing condition of the plasma processing are changed,
the acquisition unit acquires the value for the temperature of the mounting table at each of the multiple division regions, and
the monitoring unit specifies, based on the change information, the changed processing parameters from the change pattern of the value for the temperature of the mounting table at each of the multiple division regions acquired by the acquisition unit.

7. The plasma processing apparatus of claim 3,
wherein, in the mounting table, the mounting surface on which the target object is mounted is divided into multiple division regions, and the heater is provided in each of the multiple division regions,
a change pattern of a value for a temperature of the mounting table at each of the multiple division regions is stored in the change information whenever processing parameters of the processing condition of the plasma processing are changed,
the acquisition unit acquires the value for the temperature of the mounting table at each of the multiple division regions, and
the monitoring unit specifies, based on the change information, the changed processing parameters from the change pattern of the value for the temperature of the mounting table at each of the multiple division regions acquired by the acquisition unit.

8. The plasma processing apparatus of claim 4,
wherein, in the mounting table, the mounting surface on which the target object is mounted is divided into multiple division regions, and the heater is provided in each of the multiple division regions,
a change pattern of a value for a temperature of the mounting table at each of the multiple division regions is stored in the change information whenever processing parameters of the processing condition of the plasma processing are changed,
the acquisition unit acquires the value for the temperature of the mounting table at each of the multiple division regions, and
the monitoring unit specifies, based on the change information, the changed processing parameters from the change pattern of the value for the temperature of the mounting table at each of the multiple division regions acquired by the acquisition unit.

9. The plasma processing apparatus of claim 5,
wherein, in the mounting table, the mounting surface on which the target object is mounted is divided into multiple division regions, and the heater is provided in each of the multiple division regions,
a change pattern of a value for a temperature of the mounting table at each of the multiple division regions is stored in the change information whenever processing parameters of the processing condition of the plasma processing are changed,
the acquisition unit acquires the value for the temperature of the mounting table at each of the multiple division regions, and
the monitoring unit specifies, based on the change information, the changed processing parameters from the change pattern of the value for the temperature of the mounting table at each of the multiple division regions acquired by the acquisition unit.

10. The plasma processing apparatus of claim 2, further comprising:
an alarm unit configured to issue an alarm when a predetermined degree of change is detected in the processing condition of the plasma processing as a monitoring result obtained by the monitoring unit.

11. The plasma processing apparatus of claim 3, further comprising:
an alarm unit configured to issue an alarm when a predetermined degree of change is detected in the processing condition of the plasma processing as a monitoring result obtained by the monitoring unit.

12. The plasma processing apparatus of claim 4, further comprising:
an alarm unit configured to issue an alarm when a predetermined degree of change is detected in the processing condition of the plasma processing as a monitoring result obtained by the monitoring unit.

13. The plasma processing apparatus of claim 1, further comprising:
an alarm unit configured to issue an alarm when a predetermined degree of change is detected in the processing condition of the plasma processing as a monitoring obtained by the monitoring unit.

14. The plasma processing apparatus of claim 2, further comprising:
a correction unit configured to correct the processing condition of the plasma processing to eliminate a change of the processing condition when a predetermined degree of change is detected in the processing condition of the plasma processing as a monitoring result obtained by the monitoring unit.

15. The plasma processing apparatus of claim 3, further comprising:
a correction unit configured to correct the processing condition of the plasma processing to eliminate a change of the processing condition when a predetermined degree of change is detected in the processing condition of the plasma processing as a monitoring result obtained by the monitoring unit.

16. The plasma processing apparatus of claim 4, further comprising:
a correction unit configured to correct the processing condition of the plasma processing to eliminate a change of the processing condition when a predetermined degree of change is detected in the processing condition of the plasma processing as a monitoring result obtained by the monitoring unit.

17. The plasma processing apparatus of claim 1, further comprising:
a correction unit configured to correct the processing condition of the plasma processing to eliminate a change of the processing condition when a predetermined degree of change is detected in the processing condition of the plasma processing as a monitoring result obtained by the monitoring unit.

18. A monitoring method comprising:
acquiring a value for a temperature of a mounting table in a predetermined cycle, wherein a target object is mounted on the mounting table and plasma processing is performed on the target object; and based on change information indicating the change in the value for the temperature of the mounting table when the processing conditions of the plasma processing for the target object is changed, monitoring a change in a processing condition of the plasma processing from a change in the acquired value for the temperature of the mounting table.

* * * * *

UNITED STATES PATENT AND TRADEMARK OFFICE
CERTIFICATE OF CORRECTION

| | |
|---|---|
| PATENT NO. | : 10,892,144 B2 |
| APPLICATION NO. | : 16/592229 |
| DATED | : January 12, 2021 |
| INVENTOR(S) | : Shinsuke Oka |

Page 1 of 1

It is certified that error appears in the above-identified patent and that said Letters Patent is hereby corrected as shown below:

In the Claims

Column 30, Claim 1, Line 14, "the ting table" should read -- the mounting table --.

Column 32, Claim 13, Line 30, "monitoring obtained" should read -- monitoring result obtained --.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*